United States Patent [19]
Hashimoto et al.

[11] Patent Number: 5,946,548
[45] Date of Patent: Aug. 31, 1999

[54] METHOD FOR MANUFACTURING A MISFET DEVICE WHERE THE CONDUCTIVE FILM HAS A THICKNESS

[75] Inventors: Naotaka Hashimoto, Koganei; Toshifumi Takeda, Tachikawa; Yasushi Sasaki, Hachiouji; Toshikazu Matsui, Kokubunji; Yaichirou Miura, Tachikawa, all of Japan

[73] Assignees: Hitachi, Ltd., Toyo; Hitachi Microcomputer System, Ltd., Kodaira, both of Japan

[21] Appl. No.: 08/910,248

[22] Filed: Aug. 13, 1997

[30] Foreign Application Priority Data

Aug. 13, 1996 [JP] Japan ..................................... 8-213373
Jul. 2, 1997 [JP] Japan ..................................... 9-177443

[51] Int. Cl.[6] ......................... H01L 21/283; H01L 21/336
[52] U.S. Cl. .............................. 438/41; 438/187; 438/228
[58] Field of Search .................................. 438/149, 157, 438/195, 197, 241, 585, 586, 637, 645, 670; 257/288, 365, 389, 412

[56] References Cited

U.S. PATENT DOCUMENTS

| | | | |
|---|---|---|---|
| 4,528,744 | 7/1985 | Shibata | 29/571 |
| 5,445,998 | 8/1995 | Zimmer | 438/228 |
| 5,547,900 | 8/1996 | Lin | 438/187 |
| 5,550,071 | 8/1996 | Ryou | 438/41 |

FOREIGN PATENT DOCUMENTS 6-21054 1/1994 Japan .

OTHER PUBLICATIONS

A Novel Dual String Nor (DuSnor) Memory Cell EEPROM 1.28 M[2] Contactless Memory Cell Techonology for a 3V only 64 Mbit) IEDM92. 9911–993. (Electronic Materials) vol. 35, No. 5, pp. 28–32, Published by Kogyou Chousa-Kai, May, 1996.

Primary Examiner—Donald L. Monin, Jr.
Assistant Examiner—Dwayne L. Bentley
Attorney, Agent, or Firm—Antonelli, Terry, Stout & Kraus, LLP

[57] ABSTRACT

A method of manufacturing a semiconductor integrated circuit device includes the steps of forming a first conductive film on a gate oxide film in a MISFET forming region for a memory cell on a main surface of a semiconductor substrate, and forming a second conductive film via the gate oxide film to a thickness which is larger than the difference in a step between the first conductive film and the gate oxide film in a MISFET forming region for the peripheral circuit on the main surface of the semiconductor substrate, simultaneously with the formation of the second conductive film on the first conductive film in the MISFET forming region for the memory cell. Thereafter, the second conductive film is flattened by a CMP method so that the difference in the step between the second conductive film on the first conductive film in the MISFET forming region for memory cell and the gate oxide film and the difference in the step between the second conductive film in the MISFET forming region for peripheral circuit and the gate oxide film are leveled with respect to each other.

8 Claims, 43 Drawing Sheets

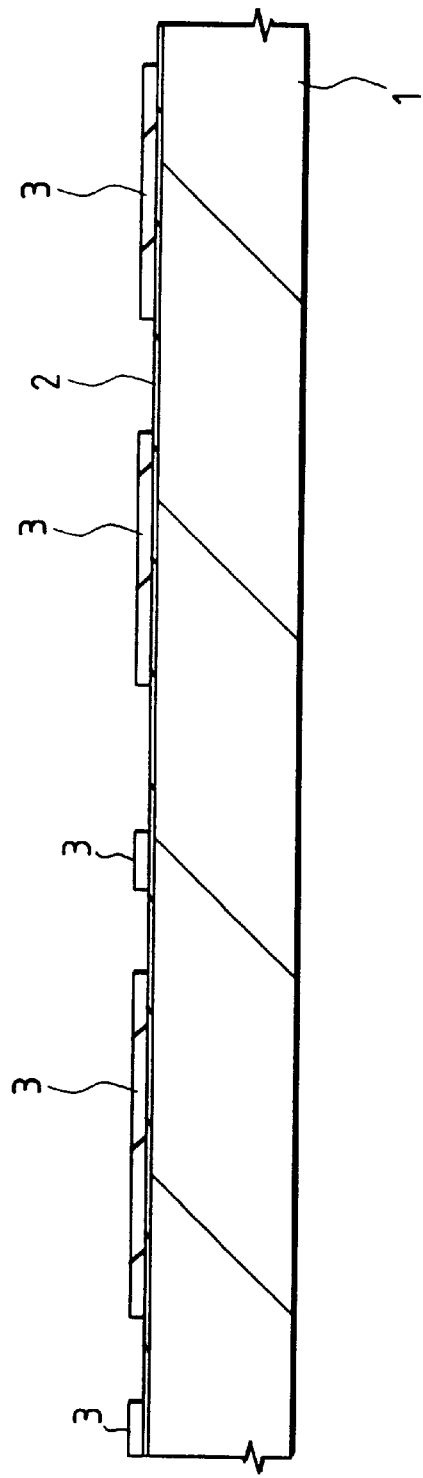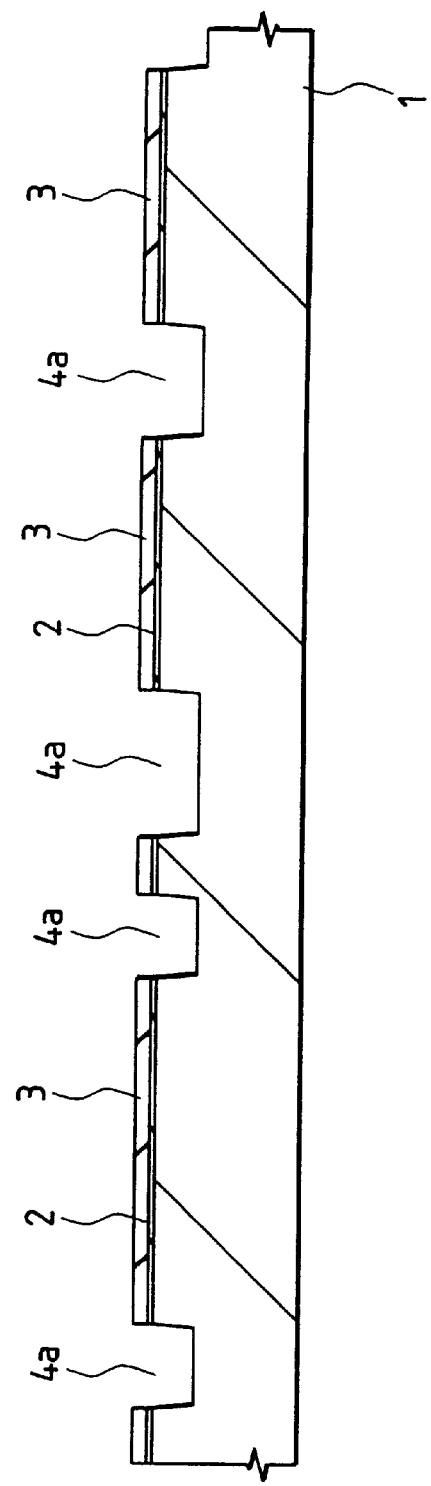

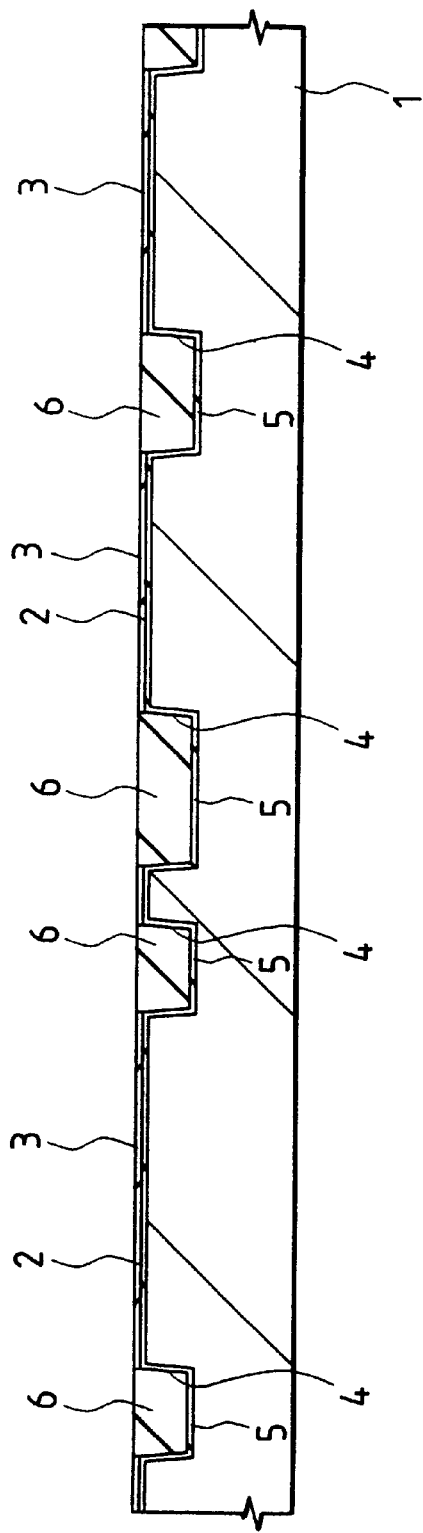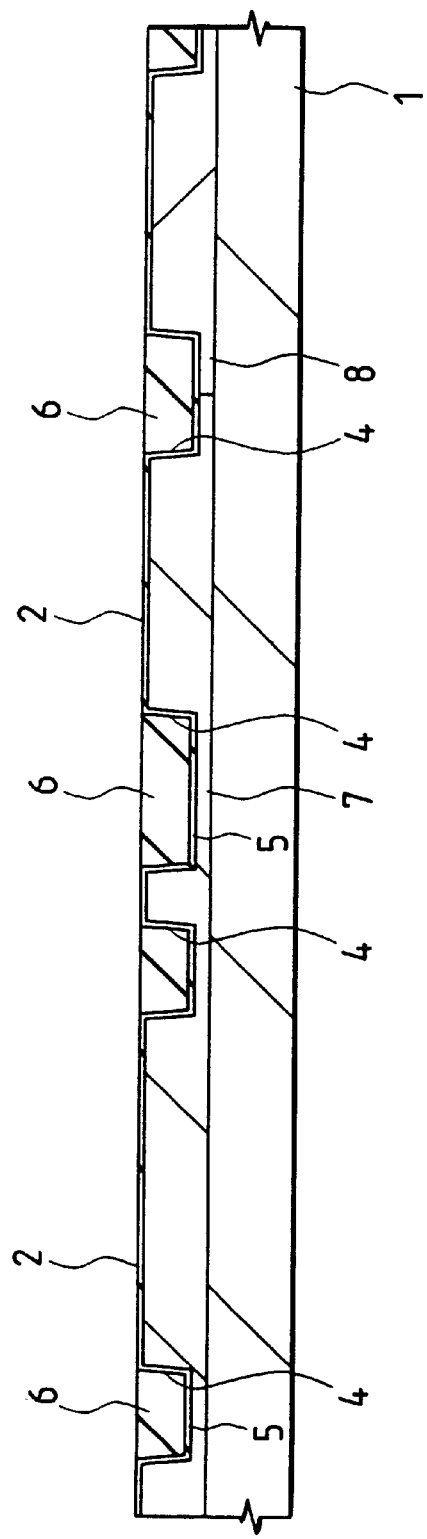

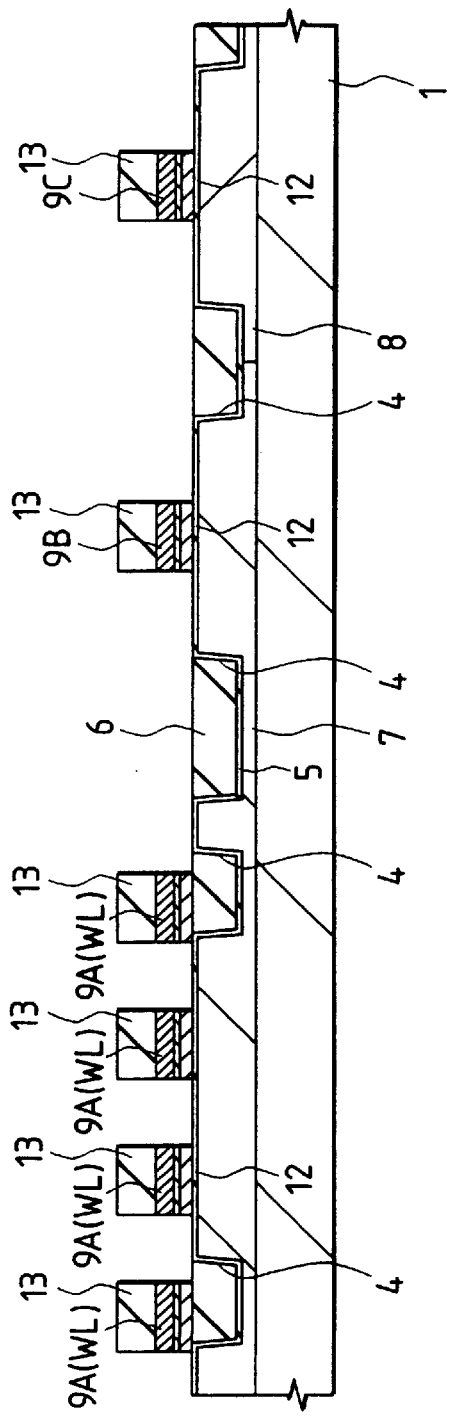
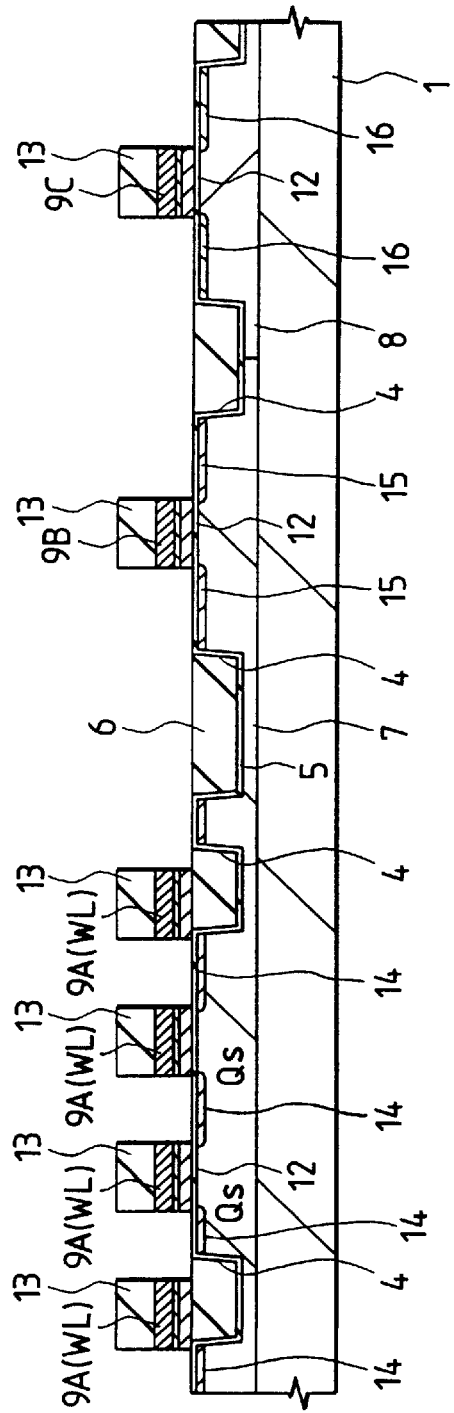

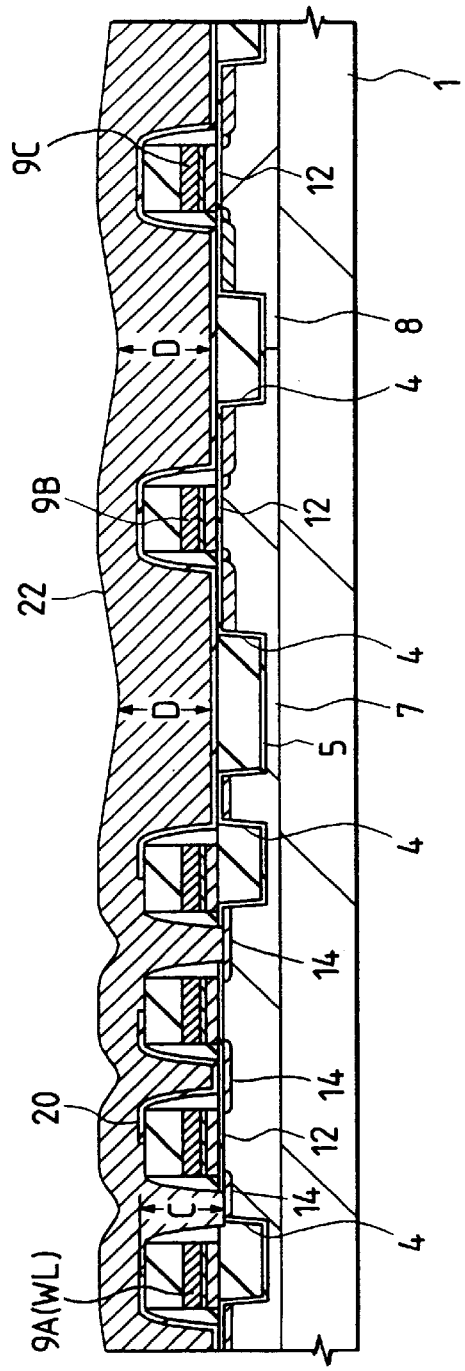
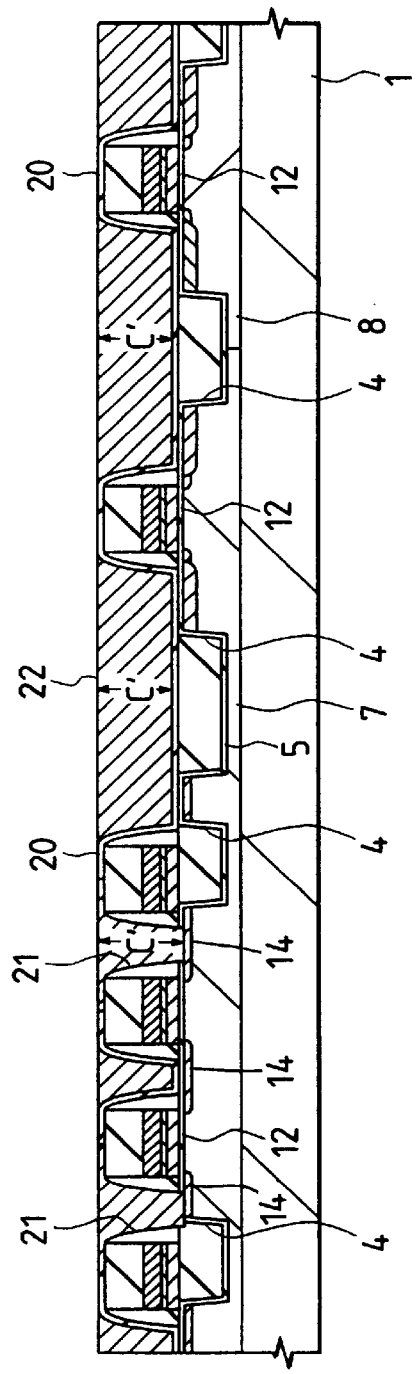

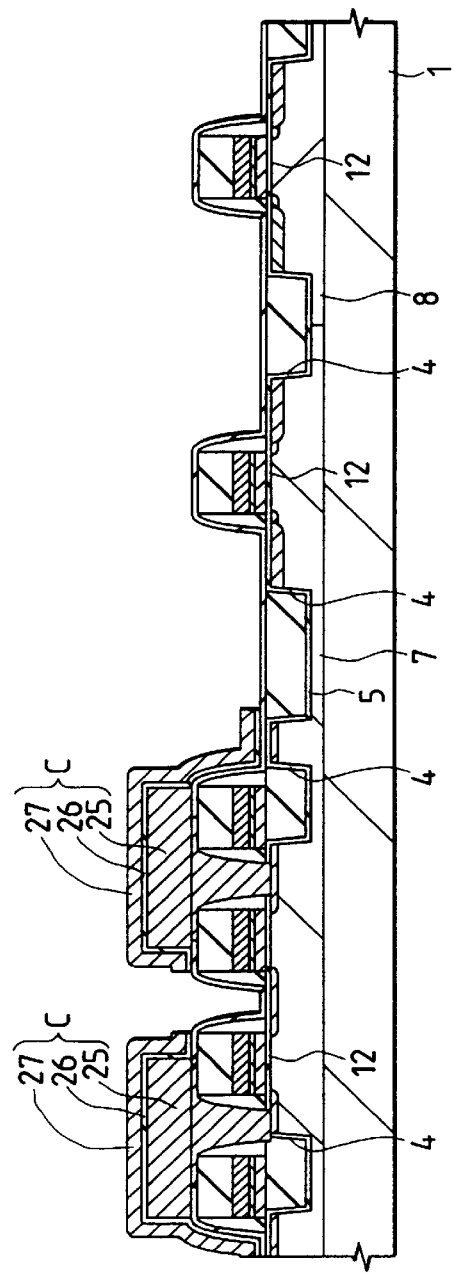
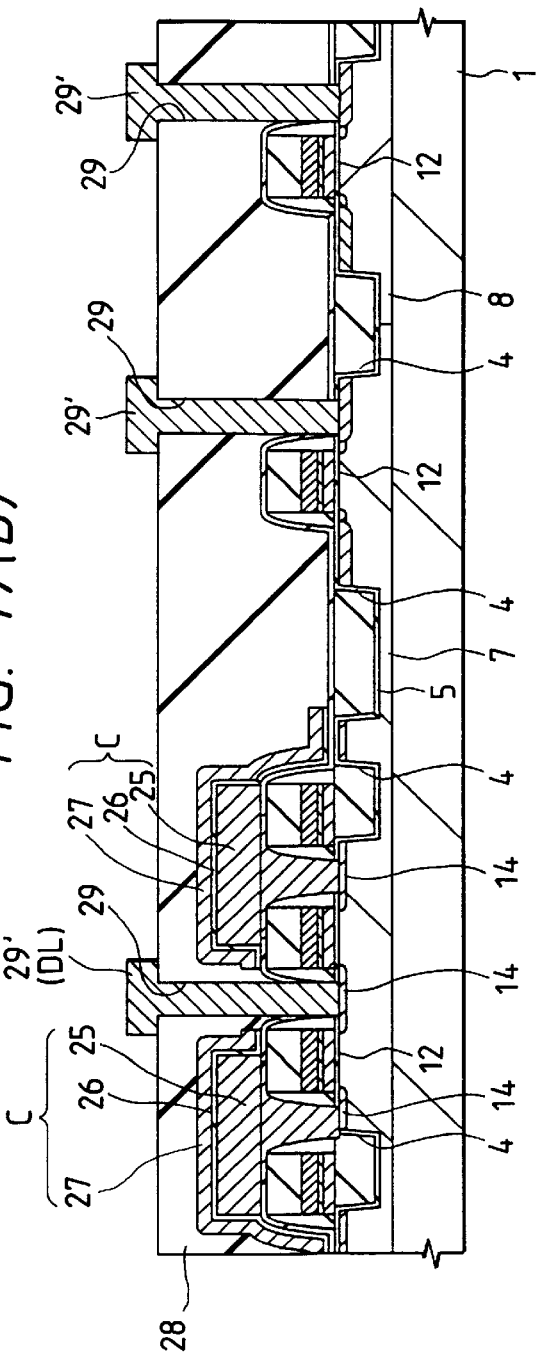

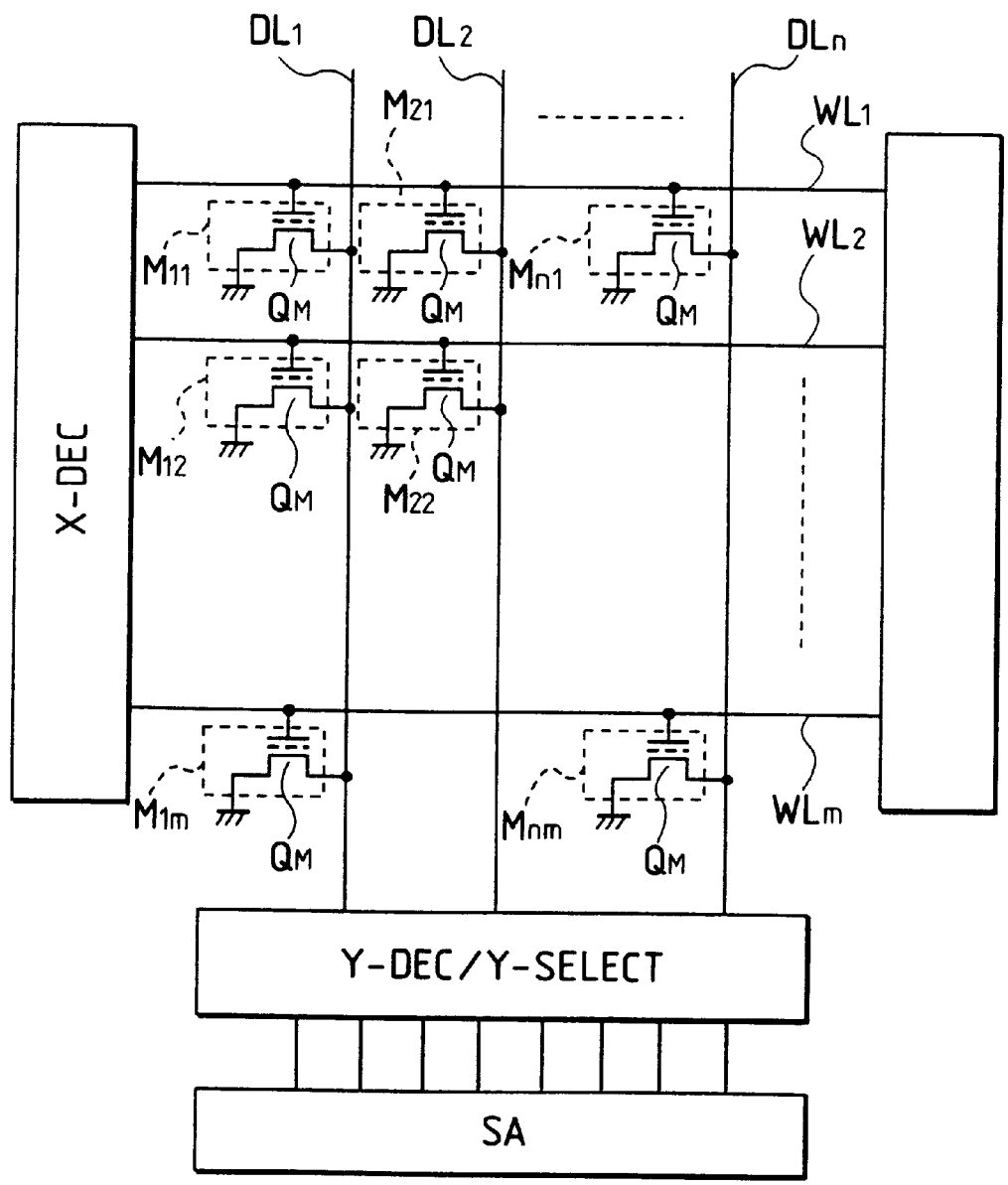

METHOD FOR MANUFACTURING A MISFET DEVICE WHERE THE CONDUCTIVE FILM HAS A THICKNESS

BACKGROUND OF THE INVENTION

This invention relates to a method of manufacturing a semiconductor integrated circuit device and more particularly, to a technique applicable to the manufacture of a semiconductor integrated circuit device having MISFET's (metal insulator semiconductor field effect transistors).

For the formation of a MISFET (metal insulator semiconductor field effect transistor) on a single crystal silicon semiconductor substrate, the usual practice is to utilize a device isolation technique using a LOCOS (local oxidation of silicon) method as a method of forming a device isolation insulating layer or film.

In the procedure for making a MISFET using the above-mentioned method, a thin silicon oxide film called a pad oxide film, is initially formed on one surface of a semiconductor substrate, on which a silicon nitride film is subsequently deposited and selectively etched to remove the silicon nitride from a device isolation region. Thereafter, the semiconductor substrate is thermally treated at approximately 1000° C. to cause a thick silicon oxide film (i.e. a field oxide film) to grow on the semiconductor surface at the device isolation region.

Next, after removal of the silicon oxide film left at a device formation region and the pad oxide film formed therebeneath by etching, the substrate surface at the device formation region is oxidized to form a gate oxide film, followed by ion implantation of an impurity for threshold voltage ($V_{th}$) control into the substrate surface of the device formation region. Thereafter, a gate electrode material, such as a polysilicon film deposited on the substrate, is subjected to patterning to form a gate electrode, followed by ion implantation of an impurity into the substrate at opposite sides of the gate electrode to form source and drain regions.

SUMMARY OF THE INVENTION

Japanese Laid-open Patent Application No. 6-21054 discloses a method wherein, when a gate electrode made of polysilicon is formed in an active region surrounded with a field oxide film formed by the above-stated method, a first polysilicon film deposited on a semiconductor substrate is flattened on the upper surface thereof to the level of the upper surface of the field oxide film, and a second polysilicon is further deposited on the flattened surface, followed by patterning of the first and second polysilicon films.

Because a thick field oxide film is formed on the substrate surface of the device isolation region according to the above method, a step is created between the surface of the field insulating film and the surface of the gate oxide film in the device formation region. At the end (i.e. a region where a bird's beak is formed) of the field oxide film which serves as a boundary between the field insulating film and the gate oxide film, an inclination which descends toward the gate oxide film is formed. Accordingly, the thickness of the gate electrode material deposited on the substrate does not become uniform over the entire surface of the substrate, but is the largest at the end (i.e. the region at which the inclination starts) of the field oxide film.

As a result, when the gate electrode material is etched through a photoresist mask, there is some apprehension that, when an etch residue left at the end of the field oxide film, which is large in thickness, is completely removed through over-etching, the thin gate oxide film may be etched off to expose the substrate.

According to the method set out in the above-stated patent application, the gate electrode material (i.e. the first and second polysilicon films) becomes the thickest on the gate oxide film in the active region. When etching conditions are so set as to be suitable for the thickest film, it may be expected that the etching off of the gate oxide in the region not covered with a gate electrode is minimized.

According to our investigations, where a floating gate constituting a flash memory cell is formed, for example, on the main surface of a semiconductor substrate and a polysilicon film deposited on the floating gate is patterned to form a control gate, the polysilicon film for the floating gate deposited on the substrate does not become uniform in thickness over the entire surface of the substrate. More particularly, the polysilicon becomes the thickest in the vicinity of the side walls of the floating gate. Eventually, when the polysilicon film is etched through a photoresist mask wherein over-etching is performed to completely remove the etch residue formed in the vicinity of the side walls of the floating gate, there is the great possibility that the gate oxide film in a peripheral circuit region may be etched off to expose the substrate.

This is true of the case where a polysilicon film deposited on a gate electrode of a MISFET for memory cell selection constituting the memory cell of a DRAM is subjected to patterning to form a lower electrode of an information storage capacitor device. In this case, the polysilicon film is etched through a photoresist mask. When the etch residue left in the vicinity of the side walls of the gate electrode of the memory cell selection MISFET at which the polysilicon film becomes the thickest is completely removed by over-etching, the gate oxide film in the peripheral circuit region is prone to etching off to expose the substrate.

The vicinity of the side walls of the floating gate and the vicinity of the side walls of the gate electrode for memory cell selection, respectively, have a surface which is inclined with respect to the main surface of the substrate. In this condition, when the photoresist formed on the polysilicon film is exposed to light so as to form a resist pattern, the exposed light is reflected on the surface of the polysilicon film in this region in oblique directions. As a consequence, the light intensity locally increases (or halation takes place), so that an intended resist pattern cannot be obtained, resulting in a poor dimensional accuracy of the control gate or the lower electrode of the capacitor element for information storage. To avoid this, attention should be paid to the optimization of the exposure conditions and the type of resist material used. This makes the process complicated, with an attendant lowering of the throughput.

An object of the invention is to provide a technique for preventing a gate oxide film from being etched off during the course of over-etching when a conductive film deposited on a gate electrode of a MISFET is patterned.

The above and other objects and features of the invention will become apparent with reference to the following description, taken in connection with the accompanying drawings.

Various features of the invention will be summarized below.

(1) According to one feature of the invention, there is provided a method of manufacturing a semiconductor integrated circuit device which comprises the steps of forming a first MISFET on a first region of a main surface of a semiconductor substrate and also a second MISFET on a second region of the main surface, forming a connection hole above one of a source and a drain of the first MISFET, forming, over the connection hole of the first region and also on a drain and source region of the second MISFET, a first conductive film which has a thickness larger than the difference in a step between the upper portion of a gate electrode of the first MISFET and a gate oxide film of the first MISFET and which has a thickness larger than the difference in a step between the upper portion of a gate electrode of the second MISFET and a gate oxide film of the second MISFET's, processing the first conductive film so that the difference in a step in a the first region and the difference in a step in the second region are substantially equal to each other, forming a second conductive film on the first conductive film, and subjecting the second conductive film to patterning in a desired shape in the first region through a photoresist mask formed on the second conductive film and simultaneously removing the second conductive film from the second region.

(2) In the method of manufacturing a semiconductor integrated circuit device of the invention, it is preferred that the first MISFET consists of a memory cell selection MISFET constituting a memory cell of a DRAM, the first and second conductive films constitute a lower electrode of an information storage capacitor element disposed on the memory cell selection MISFET, and the second MISFET is for a peripheral circuit.

(3) In the method of manufacturing a semiconductor integrated circuit device of the invention, it is preferred that the first conductive film is processed by chemical mechanical polishing (CMP).

(4) In the method for manufacturing a semiconductor integrated circuit device of the invention, it is also preferred that the first and second conductive films are each made of polysilicon.

(5) According to another feature of the invention, there is also provided a method of manufacturing a semiconductor integrated circuit device which comprises the steps of forming a gate oxide film on a first region and a second region of a main surface of a semiconductor substrate, forming a first conductive film on the first region of the main surface of the semiconductor substrate, forming, on the second region of the main surface of the semiconductor substrate and also on the first conductive film in the first region, a second conductive film in a thickness which is larger than the difference in a step between the first conductive film and the gate oxide film, processing the second conductive film so that the difference in a step between the second conductive film formed on the first conductive film in the first region and the gate oxide film and also the difference in a step between the second conductive film and the gate oxide film in the second region are made substantially flat, forming a third conductive film both on the first conductive film at the first region, and on the second conductive film at the second region, and patterning the second conductive film and the first conductive film at the first region and simultaneously patterning the second conductive film at the second region.

(6) In the method of manufacturing a semiconductor integrated circuit device of the invention in (5) above, it is preferred that the first conductive film at the first region acts as a floating gate electrode, and the third conductive film at the first region serves as a control gate electrode, and the second and the third conductive films at the second region serve as a gate electrode of a MISFET in the second region.

(7) In the method of manufacturing a semiconductor integrated circuit device of the invention, the differences in the steps are made equal to each other by CMP.

BRIEF DESCRIPTION OF THE DRAWINGS

FIGS. 2 to 9 are, respectively, sectional views of an essential part of a semiconductor substrate illustrating steps of a method for preparing a DRAM according to the first embodiment of the invention;

FIGS. 10 to 13 are, respectively, sectional views of an essential part of a semiconductor substrate illustrating steps of a method for preparing a DRAM according to a second embodiment of the invention;

FIGS. 15, 16, and 17(a) and 17(b) are, respectively, sectional views of an essential part of a semiconductor substrate further illustrating steps of a method for preparing a DRAM according to the first embodiment of the invention;

FIG. 32 is a schematic diagram of a NOR flash memory according to a third embodiment of the invention;

DESCRIPTION OF THE PREFERRED EMBODIMENTS

Figure 1:
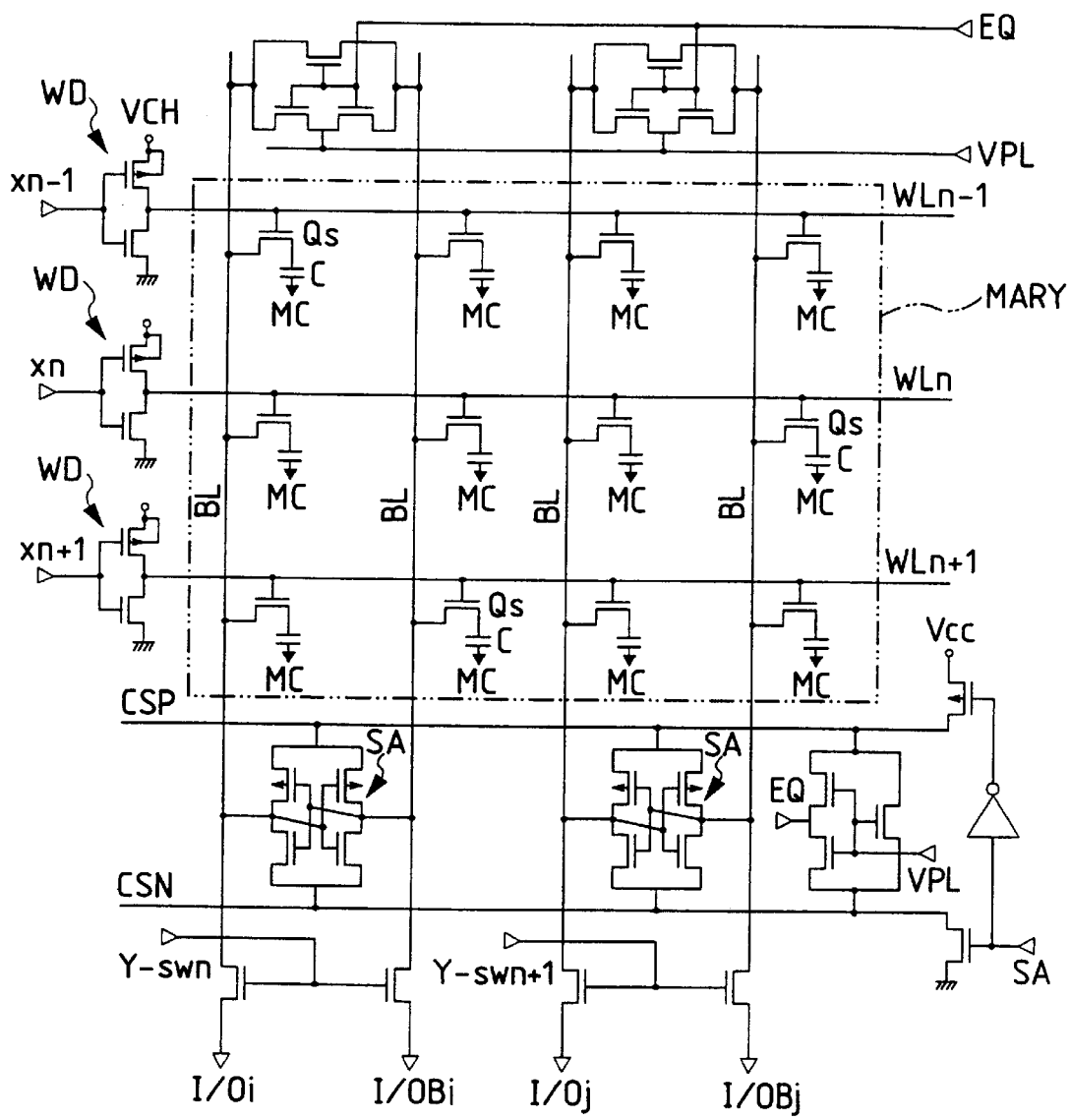
FIG. 1 is an equivalent circuit diagram of a DRAM according to a first embodiment of the invention.

Preferred embodiments of the invention are described in detail with reference to the accompanying drawings. It should be noted that like reference numerals indicate like parts or members throughout the specification unless otherwise indicated.

Embodiment 1

This embodiment is directed to the manufacture of a DRAM (dynamic random access memory) provided with memory cells, each including a stacked capacitor structure having a memory cell selection MISFET and an information storage capacitor element formed on the MISFET.

FIG. 1 is an equivalent circuit diagram of the DRAM. As shown in the figure, the memory array (MARY) of this DRAM includes a plurality of word lines WL (WLn−1, WLn, WLn+1 . . . ), a plurality of bit lines BL, and a plurality of memory cells (MC) located at the intersections of these lines. One memory cell memorizing one bit of information is constituted of one information storage capacitor element C and one MISFET Qs for memory cell selection connected in series with the capacitor element C. One of a source and a drain of the memory cell selection MISFET Qs is electrically connected to a information storage capacitor element C, and the other is electrically connected to a bit line BL. Each word line WL is connected to a word driver WD at one end thereof, and each bit line BL is connected to a sense amplifier SA at one end thereof. Circuits other than the memory array (such as word drivers WD, sense amplifiers and the like) constitute peripheral circuits and will be described hereinafter.

Figure 14:
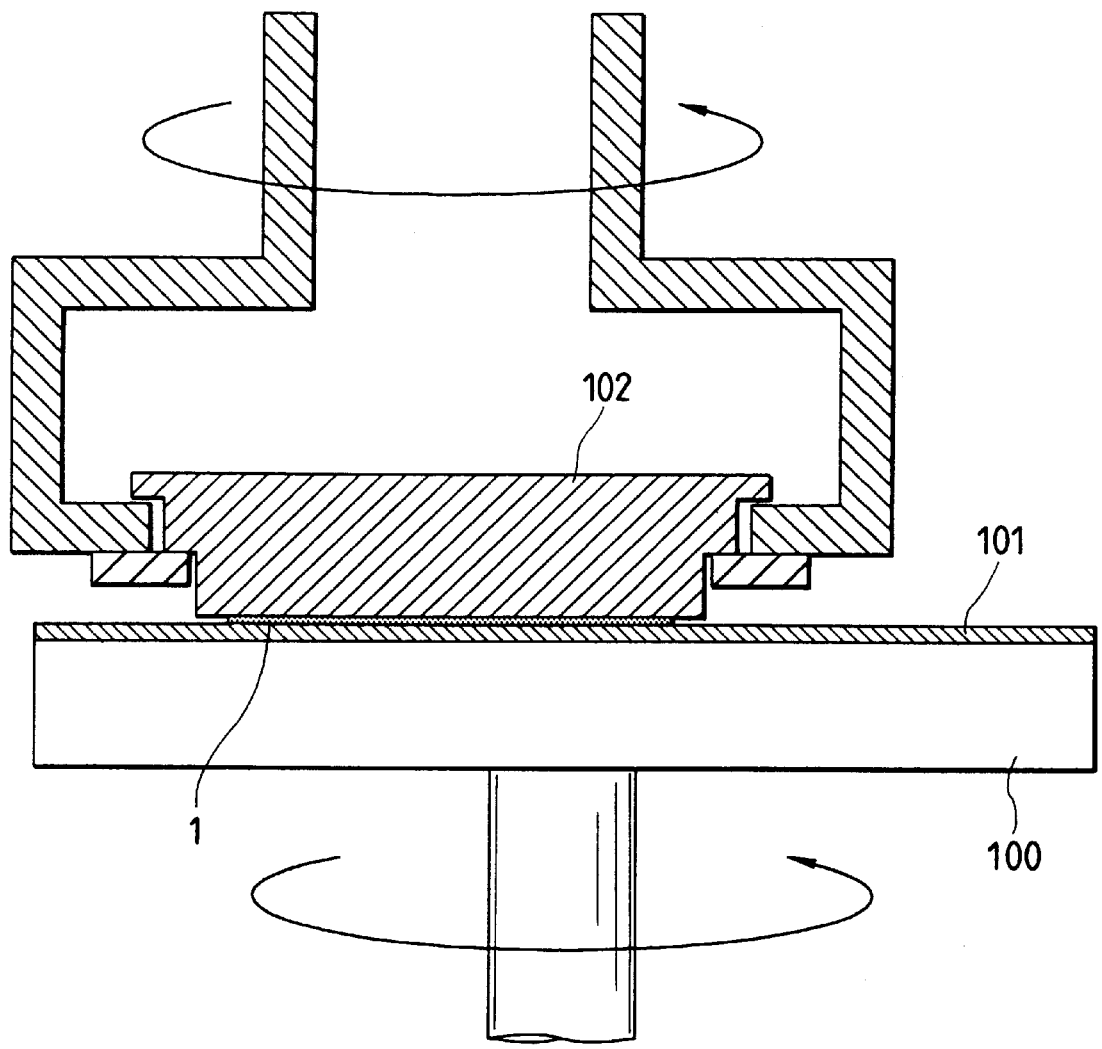
FIG. 14 is a diagram showing a CMP device.

The manufacture of the DRAM according to this embodiment of the invention will be described with reference to FIGS. 2 to 16, 17 (a) and 17(b). It will be noted that FIGS. 2 to 13, 15, 16, 17(a) and 17(b) are, respectively, sectional views of a semiconductor substrate showing part of a memory array (MARY) and also of a peripheral circuit (e.g. a sense amplifier SA), and FIG. 14 is a schematic view of a chemical mechanical polishing (CMP) device.

As shown in FIG. 2, a semiconductor substrate 1 made, for example, of single crystal silicon having a specific resistance of about 10 Ωcm is thermally treated to form a thin silicon oxide film 2 (i.e. a pad oxide film) on the entire surface thereof. Thereafter, a silicon nitride film 3 is deposited on the entire surface of the silicon oxide film 2 according to a CVD (chemical vapor deposition) method, followed by etching through a photoresist film used as a mask to selectively remove the silicon nitride film 3 from regions where a device isolation region is to be formed. The silicon oxide film 2 is formed for the purpose of relaxing a stress exerted on the substrate when a silicon oxide film, which is filled in a device isolation groove in a subsequent step, is sintered (or densified). The silicon nitride film 3 is unlikely to be oxidized in nature and can be utilized as a mask for preventing the oxidation of the substrate surface (i.e. an active region) beneath the film 3.

As shown in FIG. 3, the silicon oxide film 2 and the semiconductor substrate 1 are subjected to dry etching, for example, through the silicon nitride film 3 as a mask. In this way, grooves 4a are formed in the semiconductor substrate 1 of the device isolation regions in the region in which the nitride film 3 is deposited.

As shown in FIG. 4, in order to remove a damaged layer formed by the etching on the inner walls of each groove 4a, the semiconductor substrate 1 is, for example, thermally treated to form a thin silicon oxide film 5 on the inner walls of the groove 4a. Thereafter, a silicon oxide film 6 is deposited on the entire surface of the semiconductor substrate 1 by a CVD method, followed by thermal treatment of the semiconductor substrate 1 to densify the silicon oxide film 6, thereby improving the film properties. Subsequently, the silicon oxide film 6 is polished by a CMP method using, for example, the silicon nitride film 3 as a stopper and is thus left in the groove 4a, thereby forming a device isolation groove 4.

Next, the silicon nitride film 3 left on the semiconductor substrate 1 is removed by wet etching using, for example, hot phosphoric acid, after which as shown in FIG. 5, B (boron) is applied by ion implantation into a region (memory array) of the semiconductor substrate 1 where memory cells are to be formed and also into a region where part of a peripheral circuit (e.g. an n-channel MISFET Qn) is to be formed, thereby forming a p-type well 7. Moreover, P (phosphorus) or As (arsenic) is ion-implanted into a region of another part of the peripheral circuit (e.g. a p-channel MISFET Qp) thereby forming an n-type well 8.

Thereafter, the silicon oxide film 2 formed on the p-type well 7 and the n-type well 8 is removed by use of a HF-containing a (hydrofluoric acid) washing liquid. Thereafter, as shown in FIG. 6, the semiconductor substrate 1 is subjected to wet oxidization to form a clean gate oxide film 12 on the surfaces of the p-type well 7 and the n-type well 8, respectively. Then, gate electrodes 9A (i.e. word lines WL) of the memory cell selection MISFET's Qs, a gate electrode 9B of the n-channel MISFET Qn of the peripheral circuit, and a gate electrode 9C of a p-channel MISFET Qp are, respectively, formed on the gate oxide film 5. For the formation of the gate electrodes 9A (word lines WL) and the gate electrodes 9B, 9C, for example, a P (phosphorus) doped polysilicon film is deposited on the semiconductor substrate 1 by a CVD method, followed by further deposition of a TiN (titanium nitride) film and a W (tungsten) film by a sputtering method and then of a silicon nitride film 13 by a CVD method. Thereafter, these films are successively patterned by dry etching using a photoresist film as a mask. It will be noted that the gate electrode 9A of the memory cell selection MISFET Qs is formed integrally with the word line WL.

As shown in FIG. 7, P (phosphorus) is, for example, ion implanted into the p-type well to form n-type semiconductive regions 14 (i.e. a source and a drain) of the memory cell selection MISFET Qs and n$^-$-type semiconductive regions 15 of the n-channel MISFET Qn of the peripheral circuit. On the other hand, B (boron) is ion implanted into the n-type well 2 to form p$^-$-type semiconductive regions 16 of the p-channel MISFET Qp of the peripheral circuit.

Figure 8:
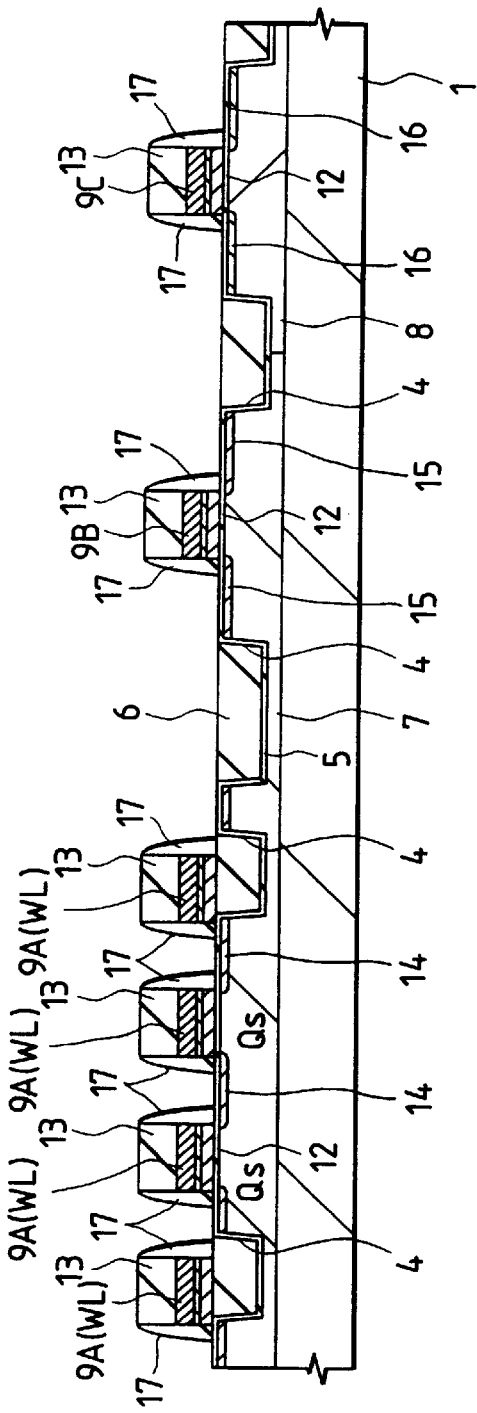

Subsequently, as shown in FIG. 8, side wall spacers 17 are formed on the side walls of the gate electrodes 9A (the word lines WL), and the gate electrodes 9B, 9C. The side wall spacer 17 is formed, for example, by patterning a silicon nitride film, which has been deposited on the entire surface of the semiconductor substrate 1 by a CVD method, according to a reactive ion etching (RIE) technique.

Figure 9:
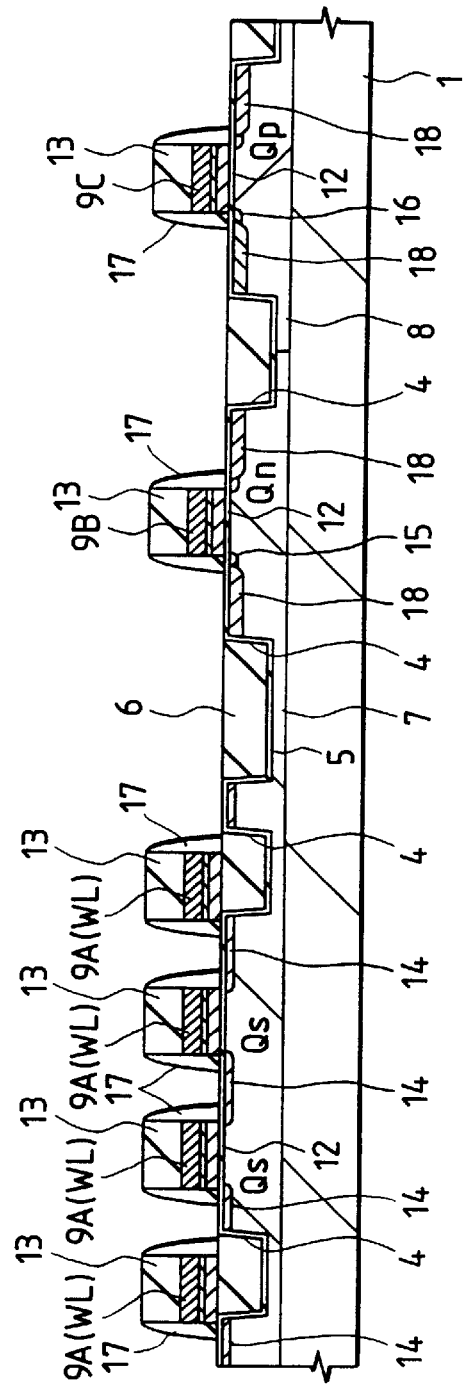

As shown in FIG. 9, As (arsenic) is, for example, ion implanted into the p-type well 7 to form n$^+$-type semiconductive regions 18 of the n-channel MISFET Qn of the peripheral circuit, and B (boron) is ion implanted into the n-type well 2 to form p-type semiconductive regions 19 of the p-channel MISFET Qp of the peripheral circuit.

Figure 10:
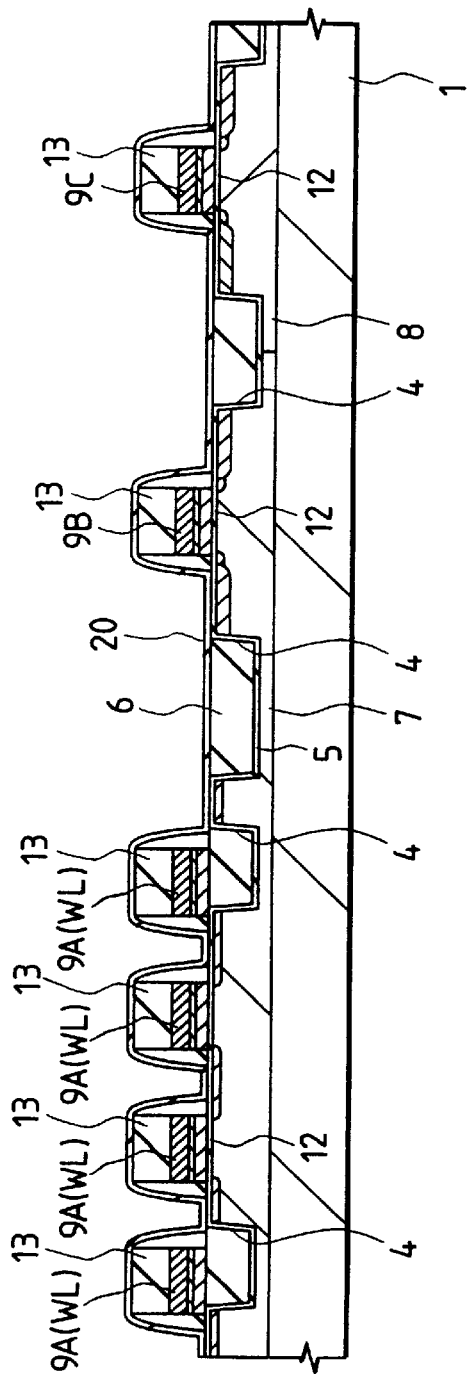
Figure 11:
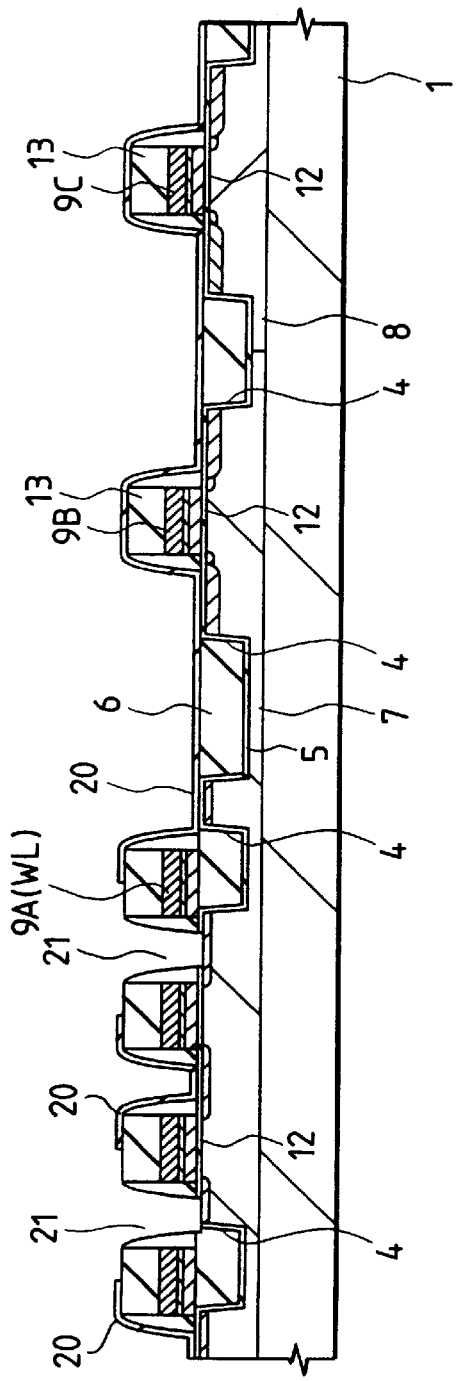

As shown in FIG. 10, a thin silicon oxide film 20 is, for example, deposited over the entire surface of the semiconductor substrate 1 by a CVD method, followed by subjecting the silicon oxide film 20 and the gate oxide film 12 above either of the source or drain (i.e. a side connected with an information storage capacitor element) of each memory cell selection MISFET Qs to selective dry etching to form a contact hole 21, as shown in FIG. 11. The silicon nitride films 13, 17, respectively, which serve as an etching stopper when the silicon oxide films 12, 20 are etched, can reduce the allowance when the contact hole 21 is formed and ensure a small memory size. Next, as shown in FIG. 12, a polysilicon film 22 is, for example, deposited over the entire surface of the semiconductor substrate 1 according to a CVD method. This polysilicon film 22 is so deposited that the thickness D of the polysilicon film 22 formed between the gate electrodes 9B and 9C of the MISFET of the peripheral circuit is larger than a difference (C) in the step between the silicon oxide film 20 formed on the gate electrode 9A (word line WL) of the memory cell selection MISFET Qs and the gate oxide film 5. More particularly, the polysilicon film 22 should be deposited over the gate electrodes 9A, 9B and 9C to have a thickness which is larger than the step difference C.

Next, as shown in FIG. 13, the polysilicon film 22 is polished, for example, by a CMP method until the surface of the silicon oxide film 20 formed above gate electrode 9A (word line WL), and the gate electrodes 9B, 9C are exposed. By this, the polysilicon film 22 above the contact hole 21 and the polysilicon film 22 formed above the gate electrode 9A (word line WL) and the gate electrodes 9B, 9C are free of any step difference therebetween and, as a whole, the polysilicon film 22 becomes leveled or flattened on the surface thereof. That is, the polysilicon film 22 is leveled at a thickness of (C') over a region including the gate electrodes 9A (word lines WL) of the memory cell selection MISFET's Qs and the gate electrodes 9B, 9C of the MISFET's of the peripheral circuit.

In order to polish the polysilicon film 22, a CMP device of the type, for example, shown in FIG. 14 is used. This CMP device has a stool 100 capable of rotating within a horizontal plane and an abrading cloth 101 containing an abrasive on the upper surface thereof. While the wafer-shaped semiconductor substrate 1 fixed at the bottom of an abrasion head 102 is rotated, the substrate 1 is urged against the abrading cloth 101 and polished. It will be noted that such a CMP is described, for example, in Denshi Zairyo (Electronic Materials) Vol. 35, No. 5, pp. 28–32, published by Kogyou Chousa-Kai, May, 1996.

Figure 15:
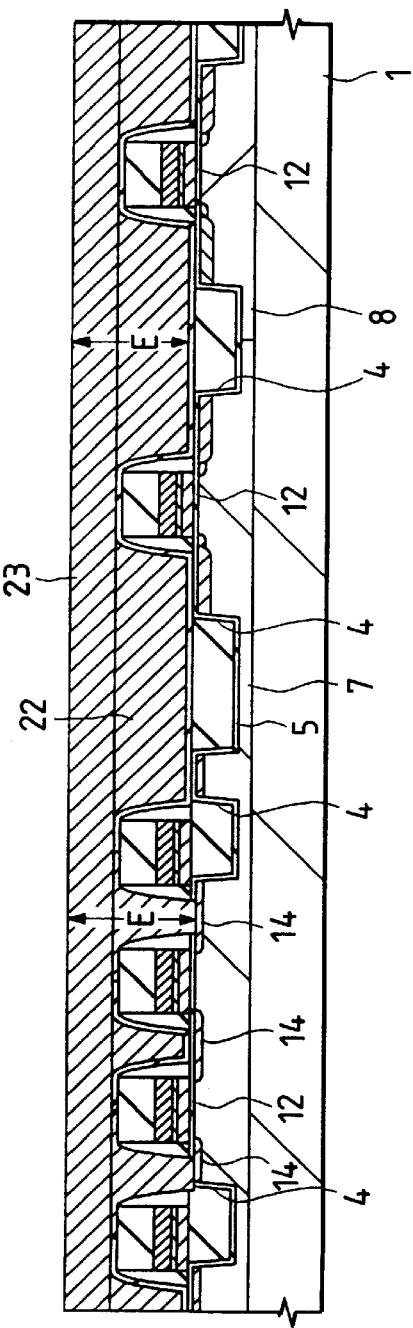

Thereafter, as shown in FIG. 15, a second polysilicon film 23 is, for example, deposited over the semiconductor substrate 1 by a CVD method. The underlying surface (i.e. the surface of the polysilicon film 22) of the polysilicon film 23 has no step, and the polysilicon film 23 has a flat surface such that the total thickness of the polysilicon films 22, 23 above the n-type semiconductive region 14 and between the gate electrodes 9B, 9C is E.

Figure 16:
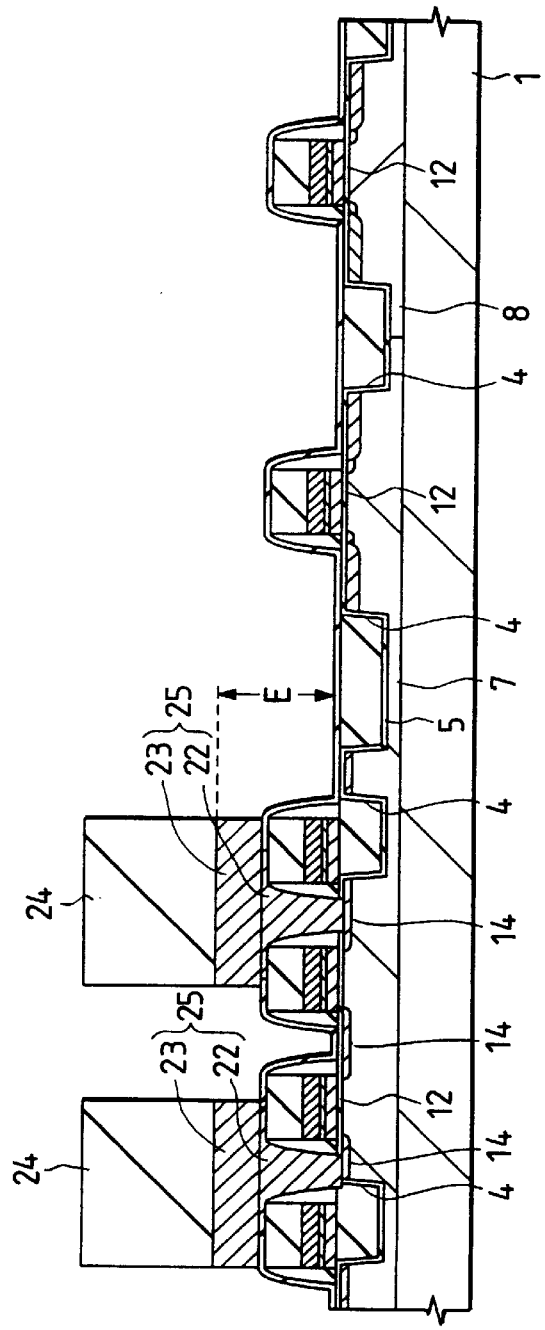

As shown in FIG. 16, the polysilicon films 23, 22 are etched through a mask made of a photoresist film 24 formed on the polysilicon film 23, thereby forming a lower electrode 25 of an information storage capacitor element. The lower electrode material to be etched (i.e. the polysilicon films 23, 22) has a maximum thickness (E) above the source region and one of the drains (the n-type semiconductive region 14) of the memory cell selection MISFET Qs. The etching conditions should be set while taking the thickness (E) into account, under which no etch residue is left on the side walls of the gate electrode 9A (word lines WL) and the gate electrodes 9B, 9C. In this way, the lower electrode 25 can be formed without over-etching the lower electrode material, so that the etching off of the gate oxide film 12 in the region not covered with the lower electrode 25 can be minimized.

When the photoresist film 24 is formed on the polysilicon film 23, the polysilicon film 23 has flat surfaces on the side walls of the gate electrode 9A (word line WL) and the gate electrodes 9B, 9C. Accordingly, exposure light is not reflected in oblique directions on the surfaces of the polysilicon film 23 in these regions. This can well prevent the photoresist film 24 from deformation in a pattern as would otherwise be caused by halation. Thus, the lower electrode 23 suffers no lowering of its dimensional accuracy. It will be noted that the lower electrode 25 is electrically connected via the contact hole 21 to the semiconductive region 14 which is either of the source and drain of the memory cell selection MISFET.

When the polysilicon film 23 is formed to be thick, the side faces (or side walls) of the polysilicon film 23 can be used as a capacitor element, thereby improving the capacitance. More particularly, a capacitor element is formed between the side surface of the polysilicon film 23 and the side surface of an upper electrode 27 described hereinafter and formed substantially vertically with respect to the main surface of the substrate 1.

Next, the photoresist film 24 is removed, after which, as shown in FIG. 17(a), a capacitor insulating film 26 made, for example, of a silicon nitride film and an upper electrode 27 made, for example, of a polysilicon film or a TiN (titanium nitride) film are formed on the lower electrode 25. Finally, as shown in FIG. 17(b), a layer insulating film 28 is deposited, for example, by a CVD method and a contact hole 29 is formed such as by etching, followed by forming a conductive film 29' as shown. The conductive layer 29' serving as a data line (DL) is electrically connected to the semiconductive region 14 which is either of a source and drain of the memory cell selection MISFET Qs. Thus, the memory cell of DRAM consisting of the memory cell selection MISFET Qs and the information storage capacitor element C is substantially completed.

As will be apparent from the foregoing, according to the manufacturing method of this embodiment, optimization is easy with respect to the etching conditions of the lower electrode material, the type of etchant gas, and the exposing conditions under which the photoresist 24 is formed, and the type of resist material, so that a satisfactory etching margin is ensured along with a simplified process of forming the lower electrode of the information storage capacitor element C.

Embodiment 2

This embodiment is directed to the manufacture of an AND flash memory wherein each memory cell is constituted of MISFET having a floating gate and a control gate. This type of AND flash memory is described, for example, in IEDM92. 9911-993, "A Novel Dual String NOR (DuSNOR) Memory Cell EEPROM 1.28 $\mu m^2$ Contactless Memory Cell Technology For A 3V-Only 64 Mbit")

Figure 18:
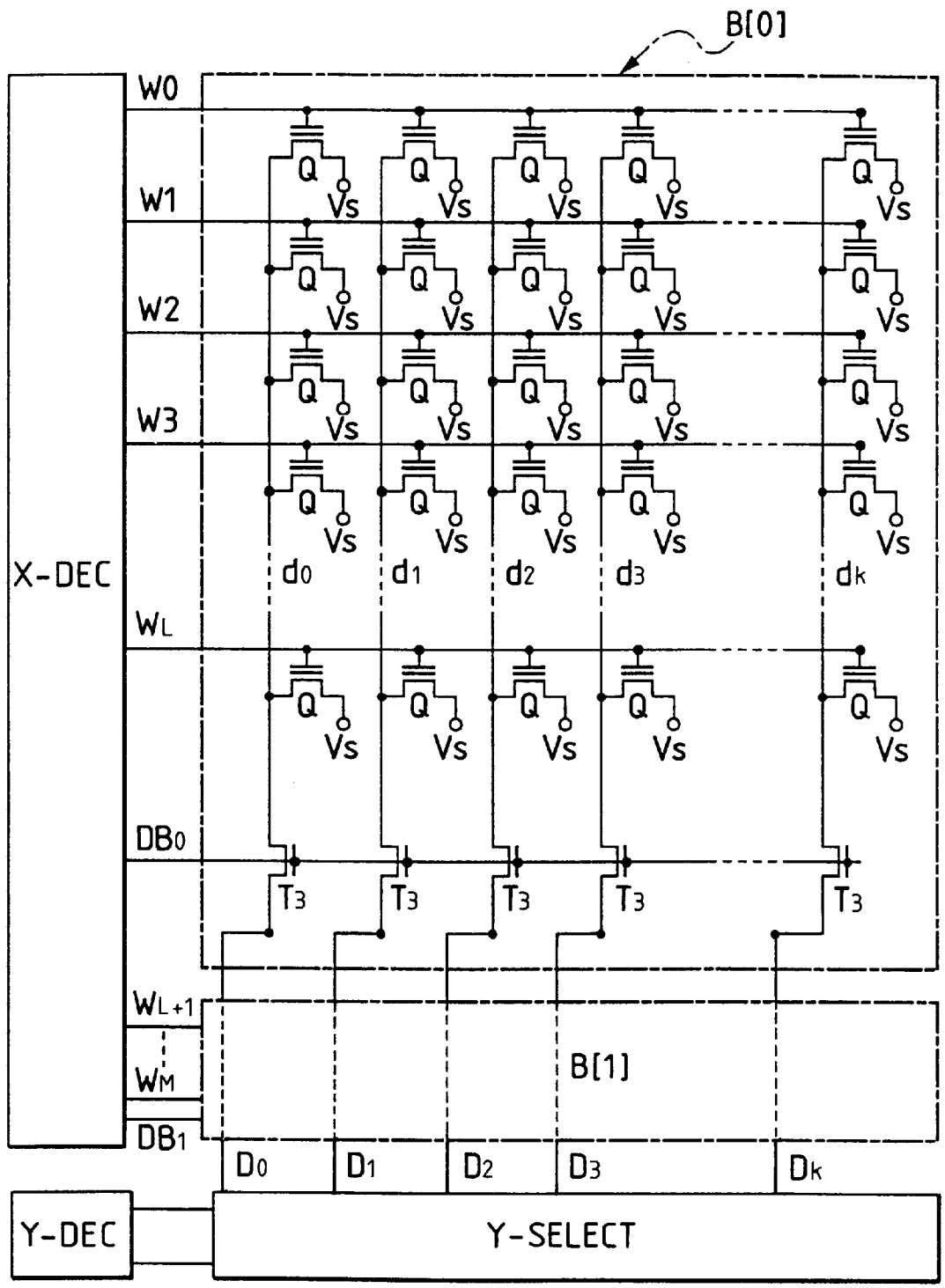
FIG. 18 is an equivalent circuit diagram of an AND flash memory according to the second embodiment of the invention.
Figure 19A:
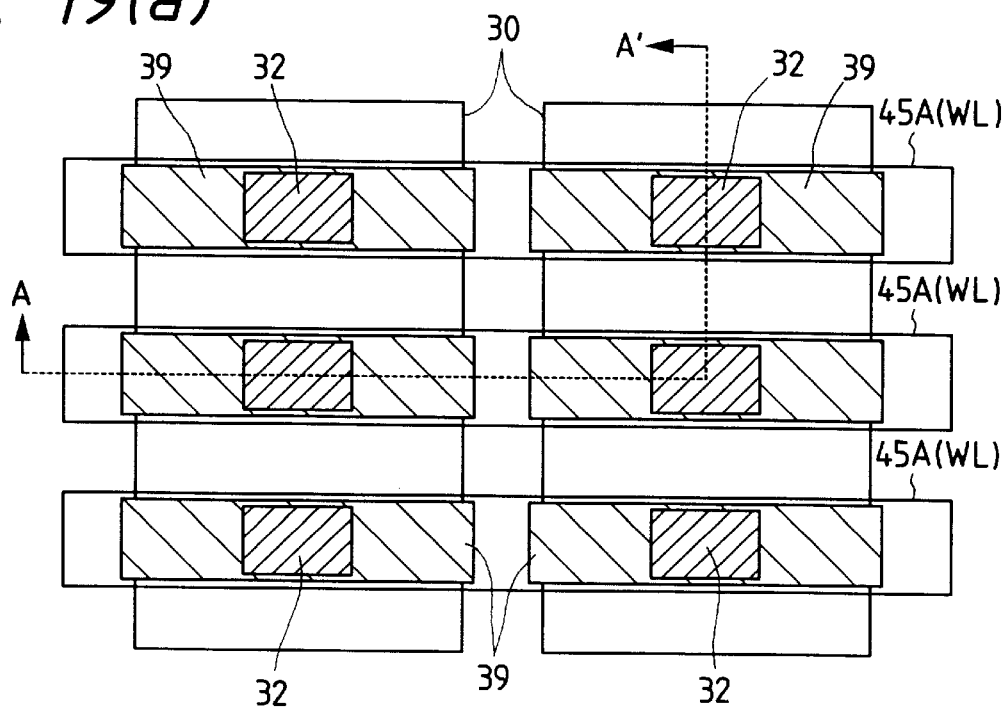
FIGS. 19(a) to 19(e) are, respectively, plan views of an essential part of the AND flash memory according to the second embodiment of the invention.
Figure 19B:
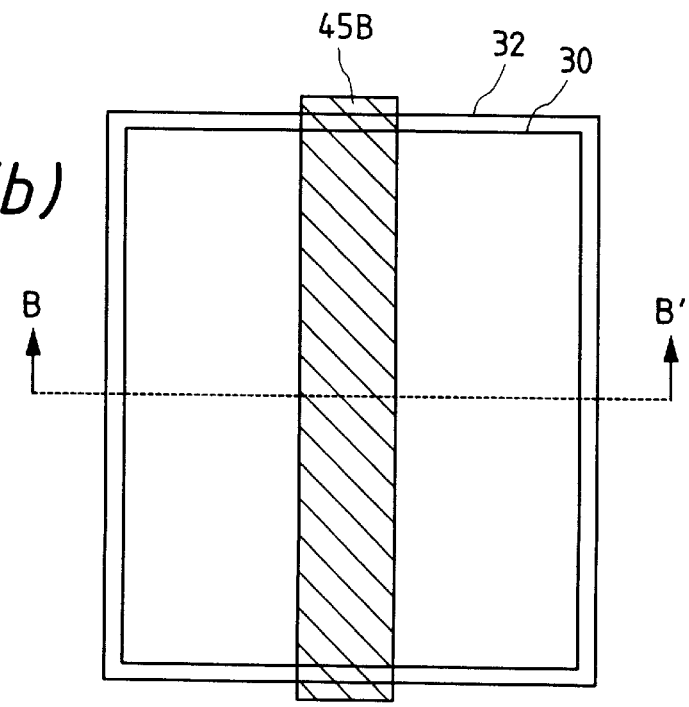
Figure 19C:
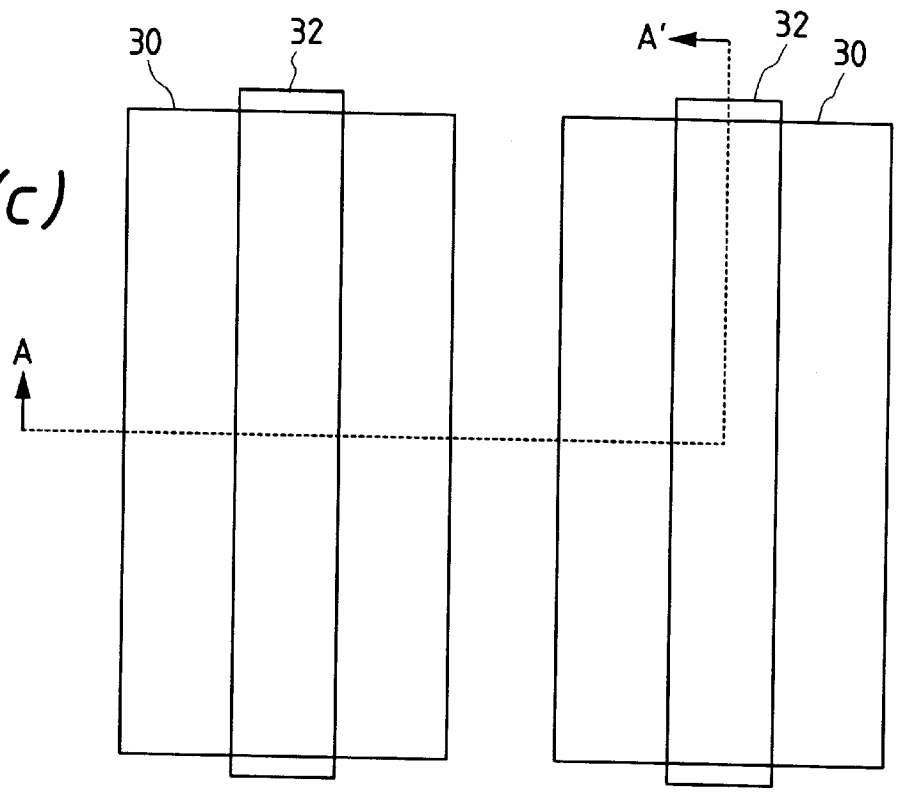
Figure 19D:
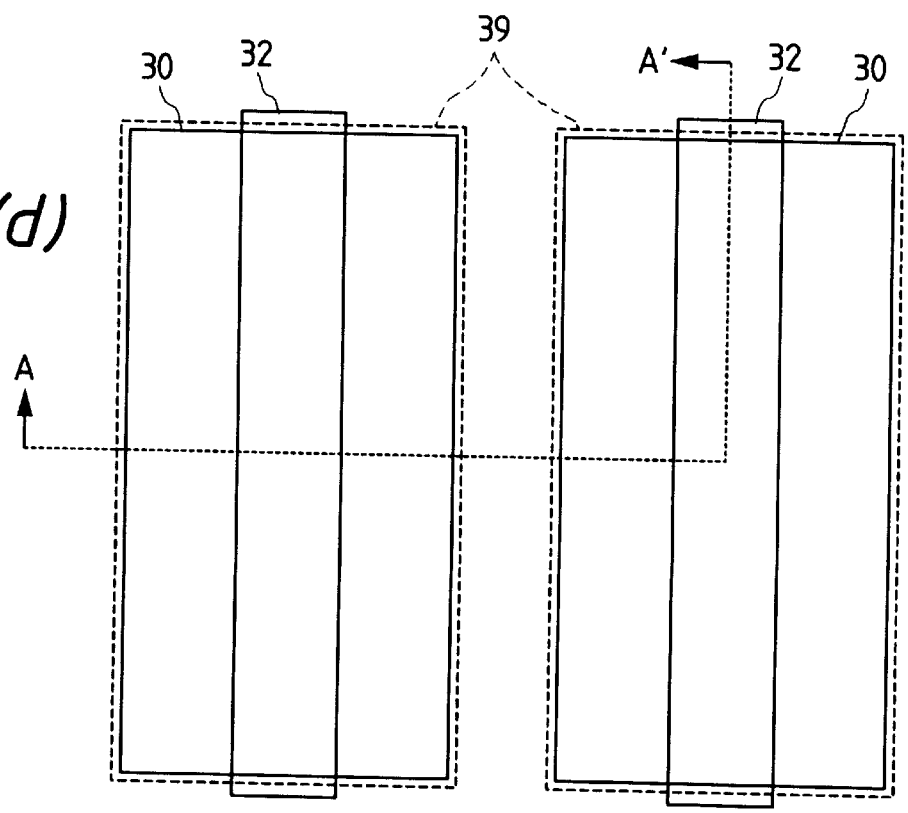
Figure 19E:
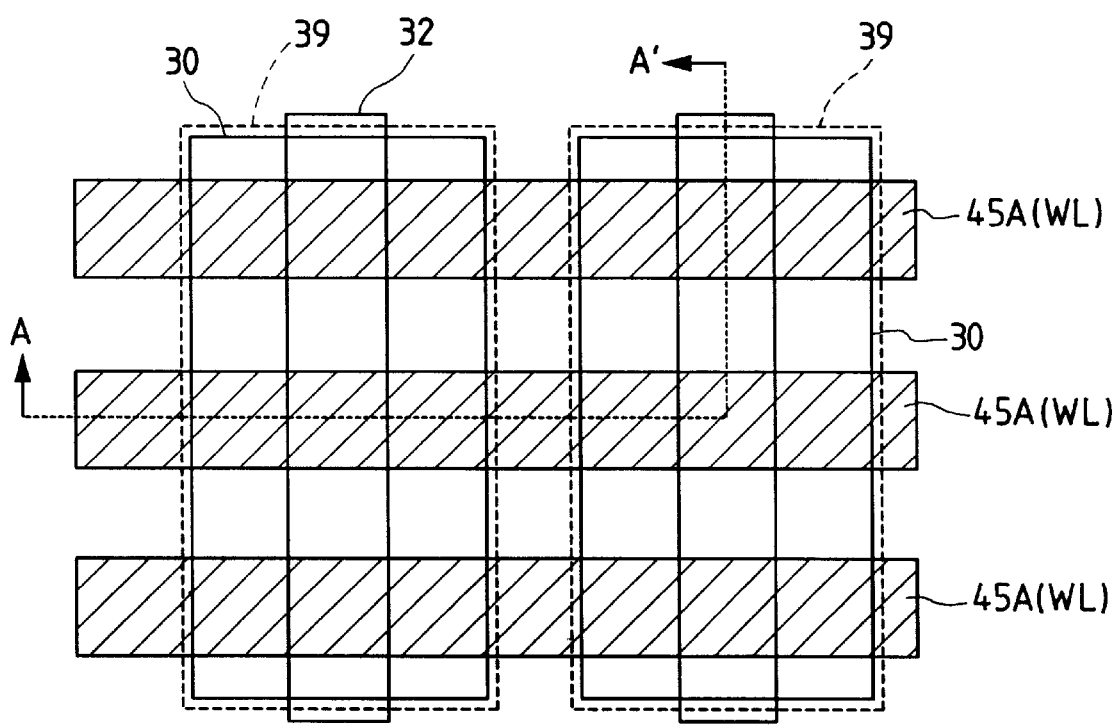

FIG. 18 is an equivalent circuit diagram of an AND flash memory according to this embodiment, FIG. 19(a) is a plan view showing an essential part of MISFET (Q) constituting a memory cell of the AND flash memory, FIG. 19(b) is a plan view showing an essential part of an n-channel MISFET Qn constituting part of a peripheral circuit of the AND flash memory, and FIGS. 19(c) to 19(e) are, respectively, a plan view of an essential part in the manufacturing process of the MISFET (Q) constituting a memory cell of the AND flash memory.

In a memory block (B[0]), each word line (WL) is made of a conductive layer 45A, extends along the row direction and is electrically connected to an X-decoder circuit (X-DEC). Buried bit lines (dk) are each made of an n-type semiconductive region 38 formed within a semiconductor substrate 1 described hereinafter and extends along the column direction. The row intersects substantially at right angles relative to the column. The buried bit lines (bk) are, respectively, connected to bit lines (Dk) via block selection MISFET's 3. The bit lines (Dk) are made of a conductive layer which has a resistance lower than the buried bit lines, extend along the column above a memory block (B[1]) adjoining along the direction of the column, and are electrically connected to a T-select circuit (Y-SELECT). Although not shown, the memory block (B[1]) is arranged similarly to the memory block [B[0]), in which buried bit lines (dk) in the memory block are electrically connected to bit lines (Dk) via block selection MISFET's 3. $DB_0$, $DB_1$ are, respectively, memory block selection lines and are electrically connected to block selection MISFET's $T_3$ and are also electrically connected to an X-decoder circuit (X-DEC). The Y-select circuit (Y-SELECT) is electrically connected to the Y decoder circuit (Y-DEC). The X-decoder circuit (X-DEC), Y decoder circuit (Y-DEC) and Y-select circuit (Y-SELECT) constitute a peripheral circuit, and are made of MISFET's Qn and Qp.

The manufacture of the flash memory according to this embodiment will be described with reference to FIGS. 20(a) to 31(b).

Figure 20A:
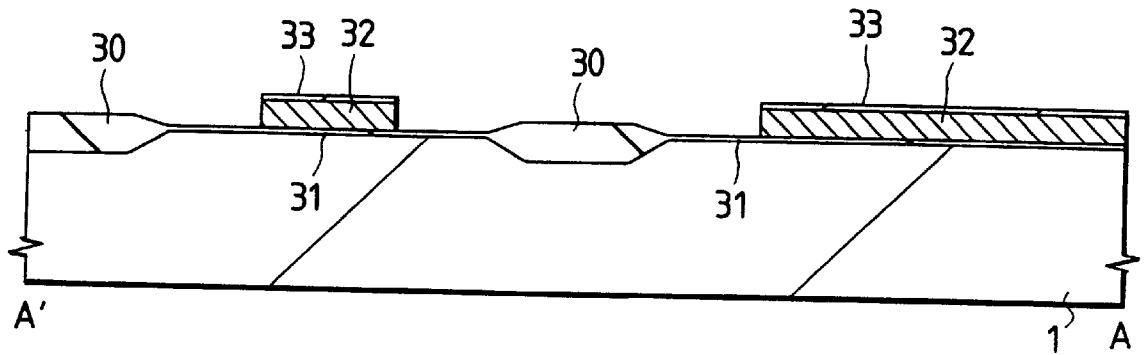
FIGS. 20(a), 20(b), 21(a), 21(b), 22(a), 22(b), 23(a), 23(b), 24(a), 24(b), 25(a), 25(b), 26(a), 26(b), 27(a), 27(b), 28(a), 28(b), 29(a), 29(b), 30(a), 30(b), 31(a), and 31(b) are, respectively, sectional views of an essential part of a semiconductor substrate illustrating steps of a method for making the AND flash memory according to the second embodiment.
Figure 20B:
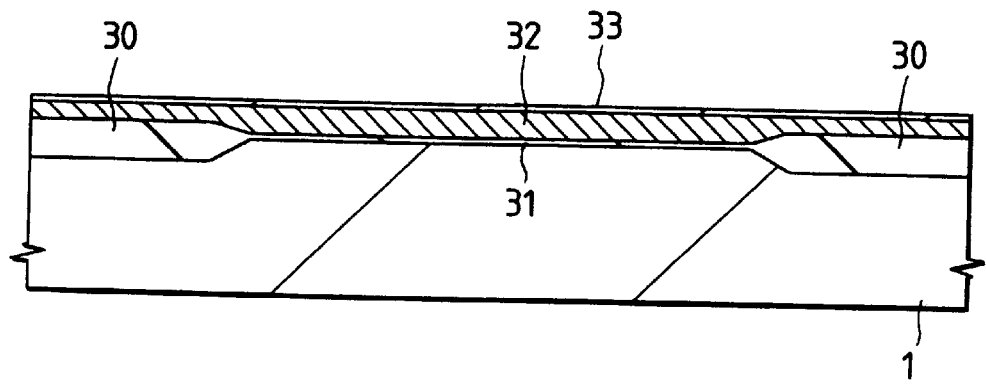

FIG. 20(a) is a sectional view taken along the line A—A' of FIG. 19(c) and FIG. 20(b) is a sectional view taken along the line B—B' of FIG. 19(b). This is true of FIGS. 21(a) to 31(a) and FIGS. 21(b) to 31(b), i.e. FIGS. 21(a) to 31(a) are, respectively, a sectional view taken along the line A—A' of FIG. 19(c) and FIGS. 21(b) to 31(b) are, respectively, a sectional view taken along the line B—B' of FIG. 19(b).

As shown in FIGS. 20(a) and 20(b), a field cxide film 20 is formed on a device isolation region of the main surface of a semiconductor substrate 1 which is made of single crystal silicon. Thereafter, a gate oxide film (a tunnel oxide film) 31 is formed on a device formation region, on which a polysilicon film 32 and a silicon nitride film 33, which become a part of a floating gate of the MISFET constituting a memory cell, are deposited entirely on the main surface according to a CVD method. Subsequently, the silicon nitride film 33 and the polysilicon film 32 in a memory cell region are subjected to patterning by use of a photoresist film as a mask, as shown in FIG. 19(c). At that time, the silicon nitride film 33 and the polysilicon film 32 in the peripheral circuit region are not subjected to patterning.

The polysilicon film 32 may be deposited over the semiconductor substrate 1 in the following manner. Initially, a first polysiiicon film is deposited to a thickness larger than the difference in the step between the field oxide film 30 and the gate oxide film 31, followed by polishing of the polysilicon film by a CMP method until the field oxide film 30 is exposed on the surface thereof. Thereafter, a second polysilicon film is further deposited over the semiconductor substrate 1. In this case, the polysilicon film 32 is made of two polysilicon layers.

Figure 21A:
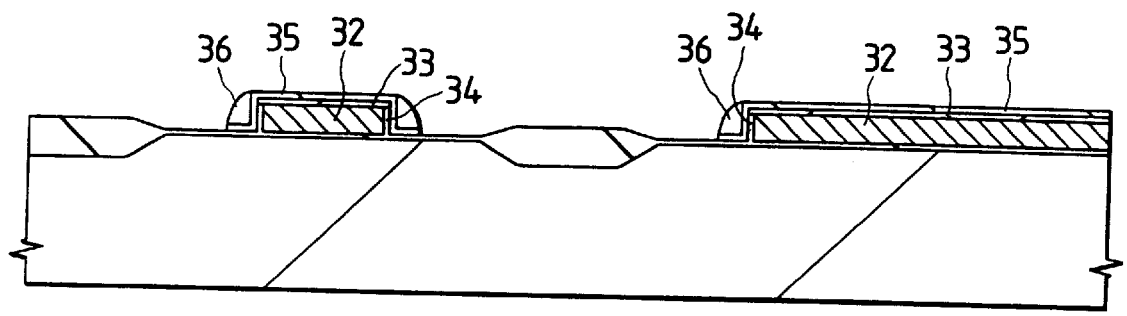
Figure 21B:
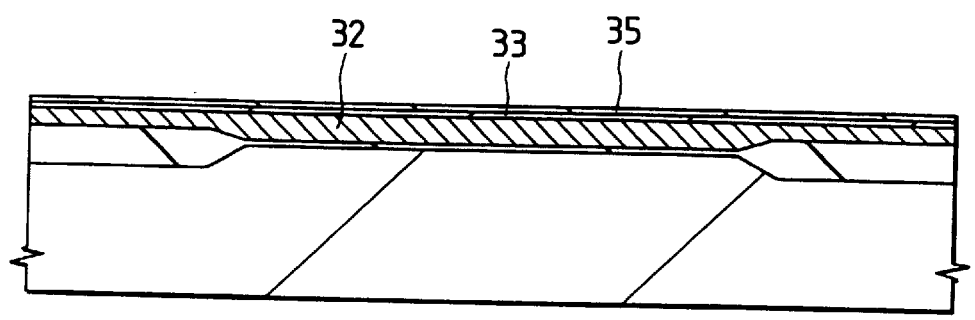

As shown in FIGS. 21(a) and 21(b), the semiconductor substrate 1 is thermally oxidized to form a silicon oxide film on the side walls of the polysilicon film 32, and a silicon nitride film 35 and a silicon oxide film are successively deposited on the semiconductor substrate 1 according to a CVD method, followed by subjecting the silicon oxide film to a reactive ion etching (RIE) method to form a side wall spacer 36 on the side walls of the polysilicon film 32.

Figure 22A:
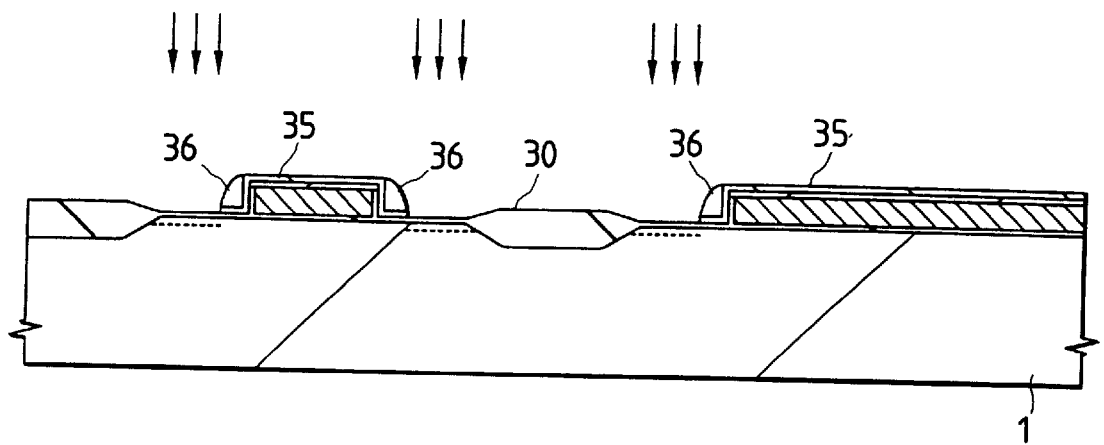
Figure 22B:
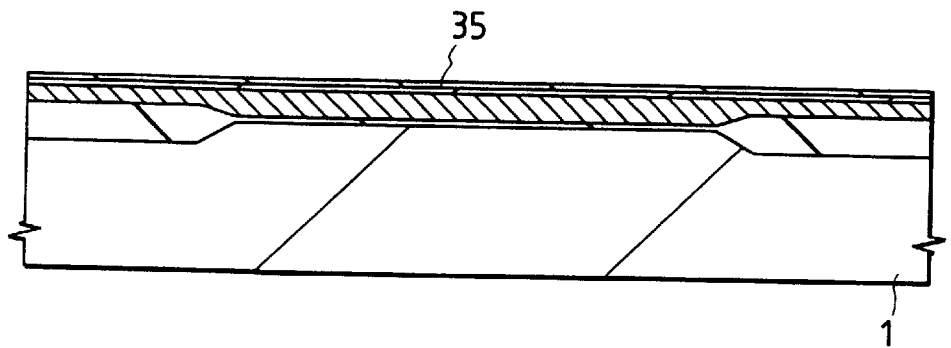
Figure 23A:
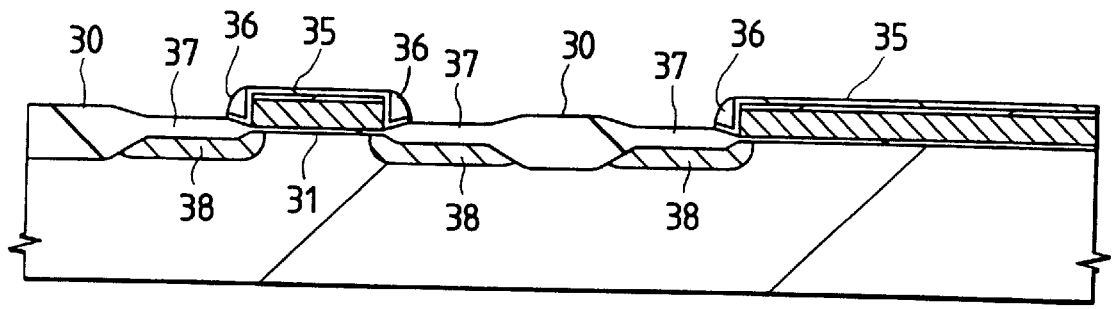
Figure 23B:
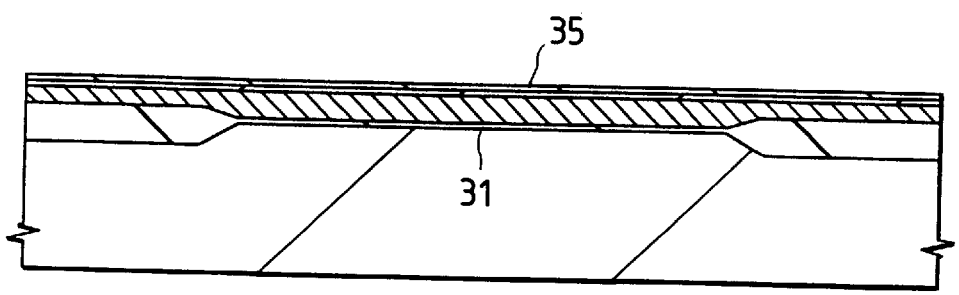

As shown in FIGS. 22(a) and 22(b), an n-type impurity (e.g. As (arsenic)) is ion implanted into a memory cell region of the semiconductor substrate 1. Thereafter, as shown in FIGS. 23(a) and 23(b), the semiconductor substrate 1 is thermally oxidized through the silicon nitride film 35 as a mask, thereby making part of the field oxide film 30 and the gate oxide film 31 thick in the memory cell region. At this time, the n-type impurity (As) is diffused into the substrate, and n-type semiconductive regions 38 (a source and a drain) of MISFET constituting a memory cell are formed beneath the silicon oxide film 37 which has been made thick.

Figure 24A:
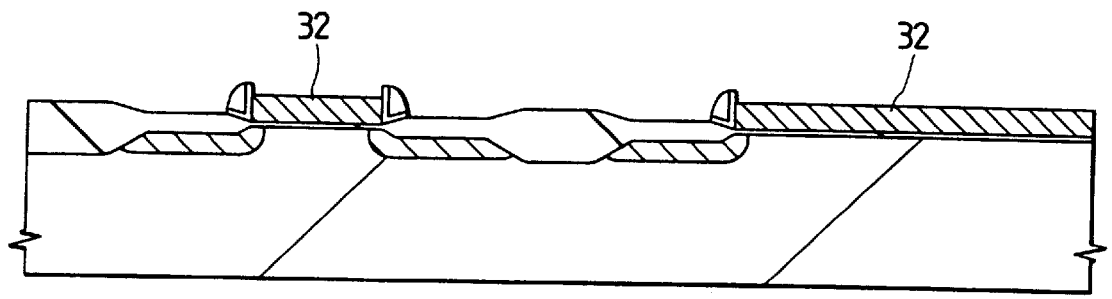
Figure 24B:
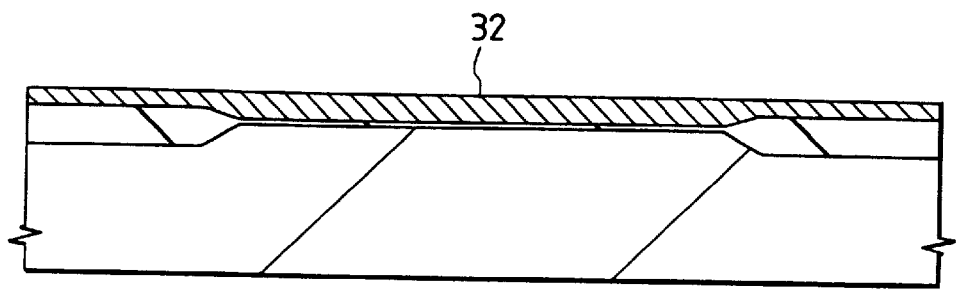

As shown in FIGS. 24(a) and 24(b), the silicon nitrides films 35, 33, which cover the polysilicon film 32 of the memory cell region and the polysilicon film 32 of the peripheral circuit, are removed by etching until the polysilicon film 32 is exposed on the surface thereof.

Figure 25A:
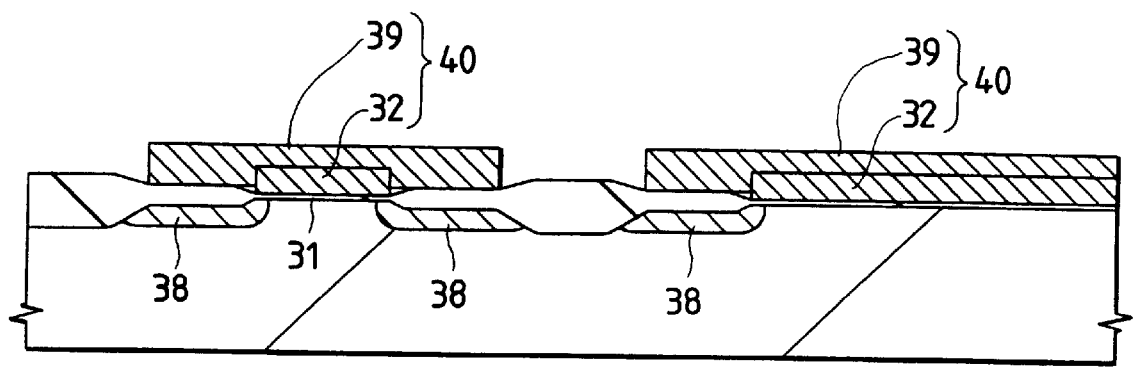
Figure 25B:
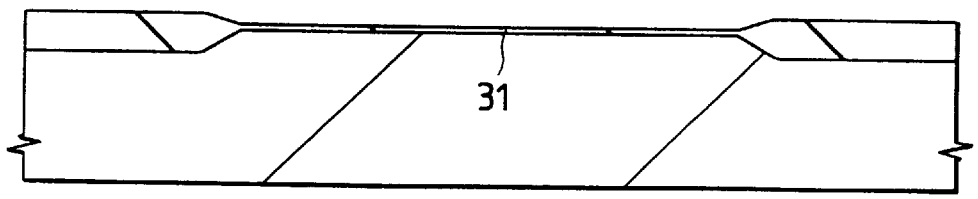

As shown in FIGS. 25(a) and 25(b), a polysilicon film 39 having a thickness larger than the difference in the step between the polysilicon film 32 and the gate oxide film 31 is deposited over the semiconductor substrate 1 by a CVD method. Thereafter, the polysilicon film 39 is subjectad to patterning by dry etching using a photoresist mask as is particularly shown in FIG. 19(d), to form a conductive layer pattern serving as a floating gate 40 of a memory cell, which is made of a built-up film of the polysilicon film 32 and the polysilicon film 39.

The polysilicon film 39 may be deposited over the semiconductor substrate 1 in the following manner. Initially, a first polysilicon film having a thickness larger than the difference in the step between the polysilicon film 32 and the gate oxide film 31 is deposited and then polished according to a CMP method until the surface of the silicon nitride film 35 is exposed, followed by removal of the silicon nitride films 35, 33 by etching. Thereafter, a second polysilicon film is deposited over the semiconductor substrate 1 to form a polysilicon film 39 made of the two-layered polysilicon film.

Figure 26A:
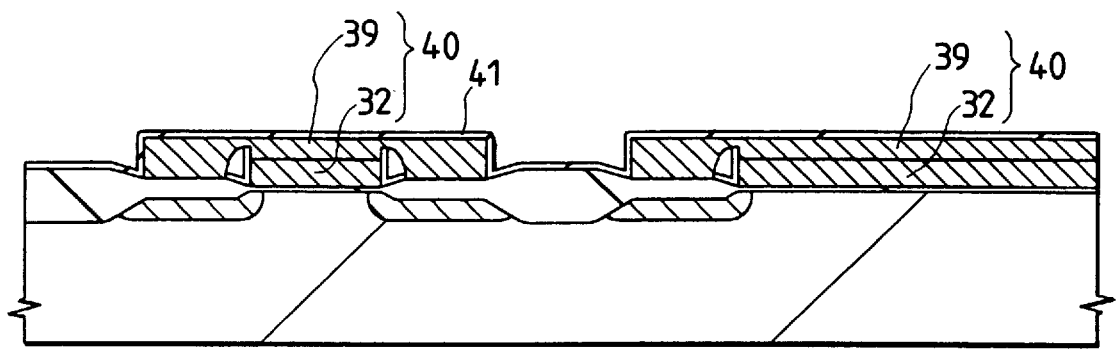
Figure 26B:
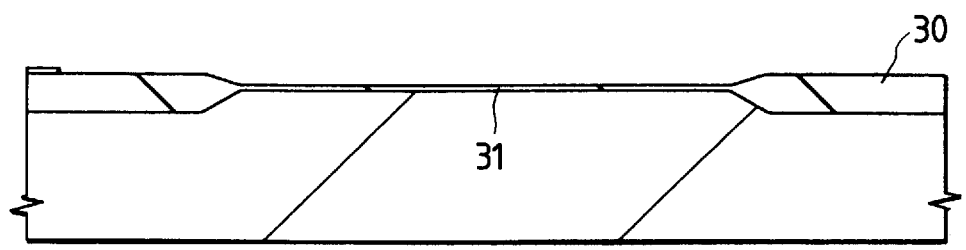

Next, as shown in FIGS. 26(a) and 26(b), a second insulating gate film 41 of the memory cell is formed on the conductive layer pattern serving as the floating gate 40. The second gate insulating film 41 is constituted, for example, of a three-layered film of a silicon oxide film, a silicon nitride film and a silicon oxide film.

Figure 27A:
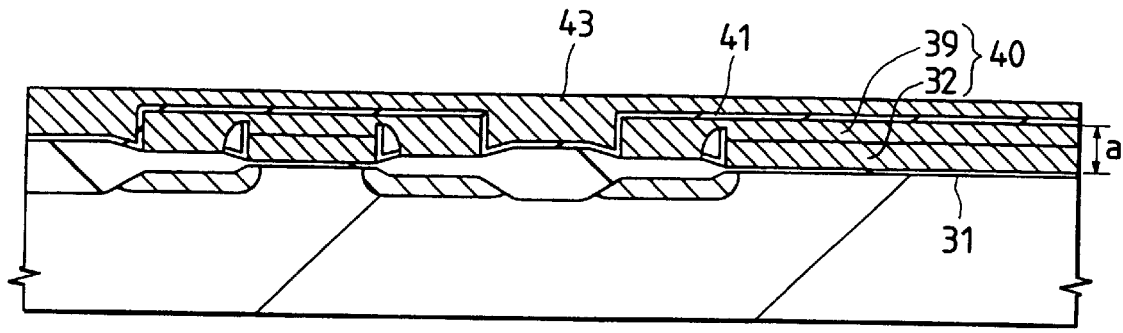
Figure 27B:
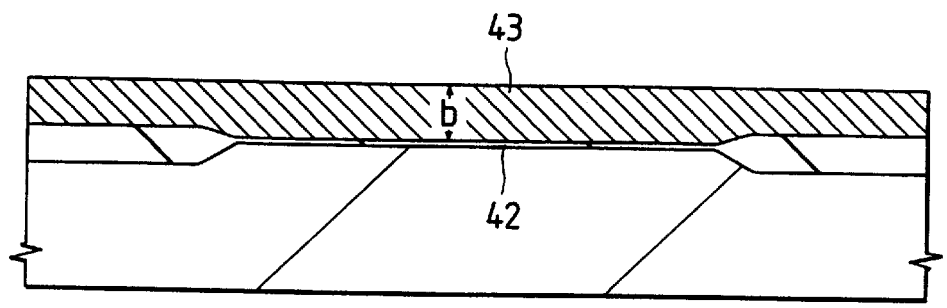

As shown in FIGS. 27(a) and 27(b), the semiconductor substrate 1 is thermally oxidized to form a gate oxide film 42 in the peripheral circuit region, followed by deposition of a polysilicon film 42 over the entire surface of the semiconductor substrate 1 by a CVD method. The polysilicon film 43 is deposited to a thickness which is larger than the difference (a) in the step between the second insulating film 41 formed on the conductive layer pattern serving as the floating gate 40 and the gate oxide film 42 (or the gate oxide film 31) in the peripheral circuit region. More particularly, the polysilicon film 43 is so formed in the gate electrode-forming region of the peripheral circuit region that its thickness (b) is larger than the step difference (a).

Figure 28A:
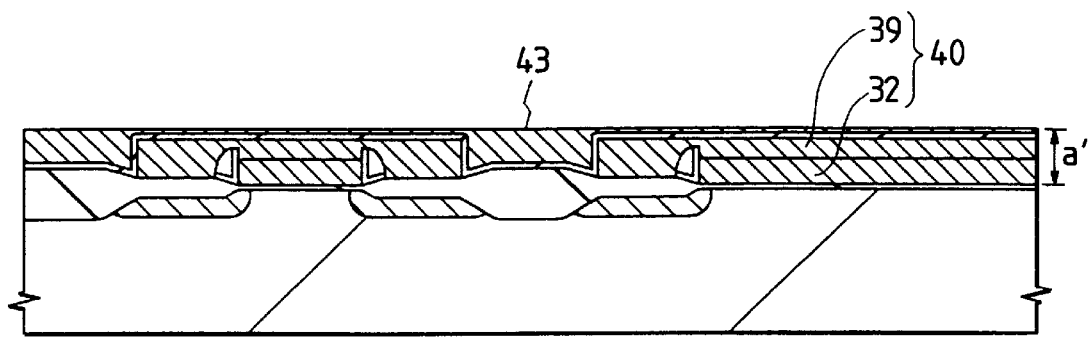
Figure 28B:
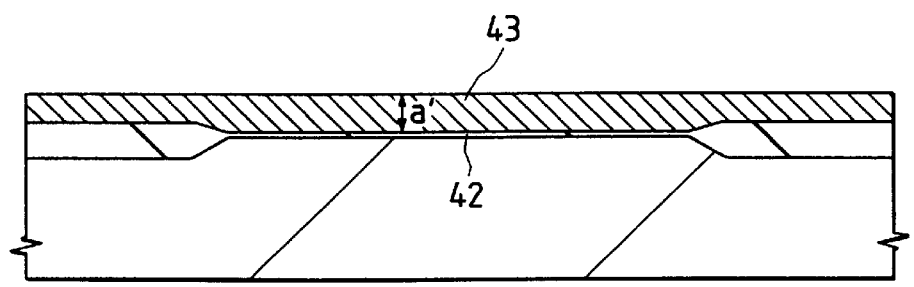
Figure 38A:
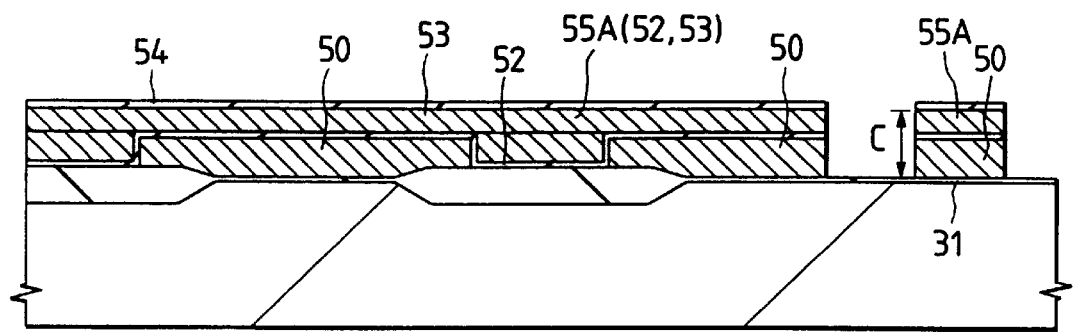
Figure 38B:
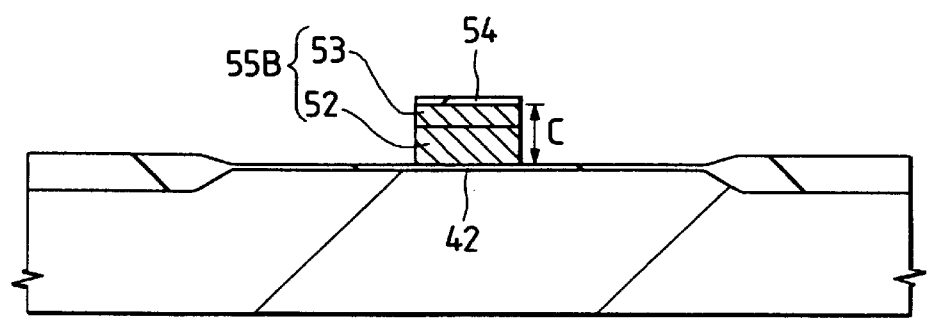

As shown in FIGS. 28(a) and 38(b), the polysilicon film 43 is polished so that the above-mentioned step difference and the thickness of the polysilicon film in the gate electrode-forming region of the peripheral circuit region or on the gate oxide film 42 are a' in total. Thus, the surface becomes flattened. In order to prevent damage to the second insulating film 41, care should be taken to not expose the surface thereof.

Figure 29A:
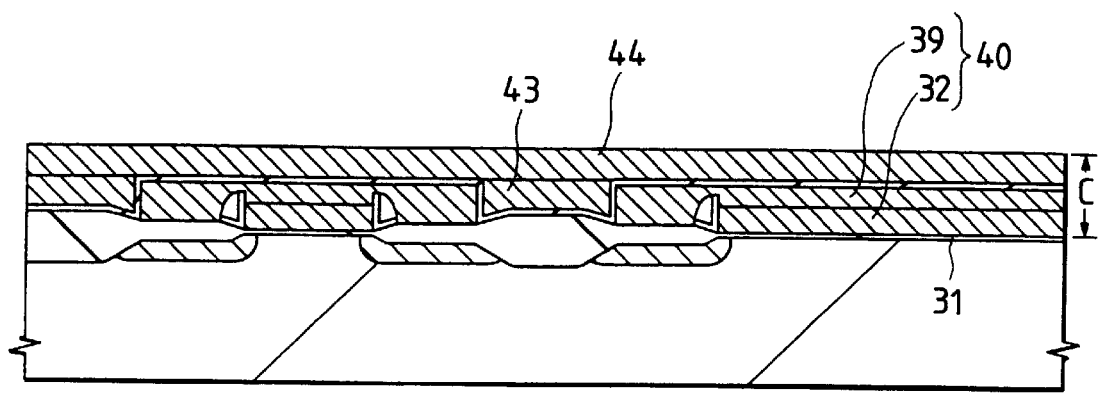
Figure 29B:
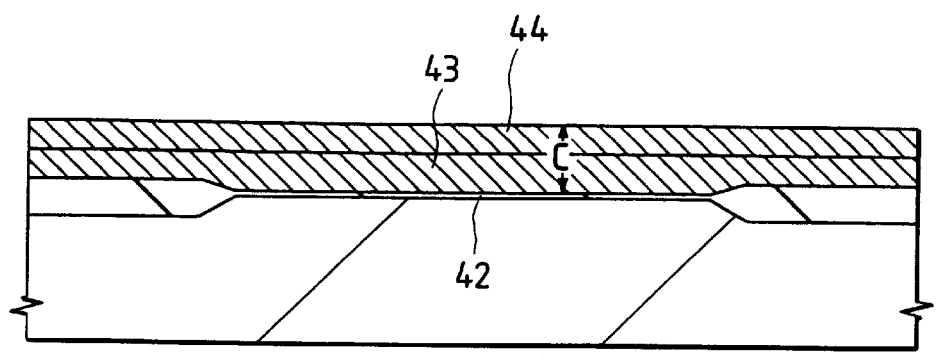

As shown in FIGS. 29(a) and 29(b), a polysilicon film 44 is further deposited over the semiconductor substrate 1 by a CVD method. No step difference exists in the underlying of the polysilicon film 44. Accordingly, the surface of the polysilicon film 44 becomes leveled such that the step difference between the polysilicon film 44 and the gate oxide film 31 or the total thickness of the polysilicon films 43, 44 in the gate electrode-forming region of the peripheral circuit region (or on the gate oxide film 42) becomes C.

Figure 30A:
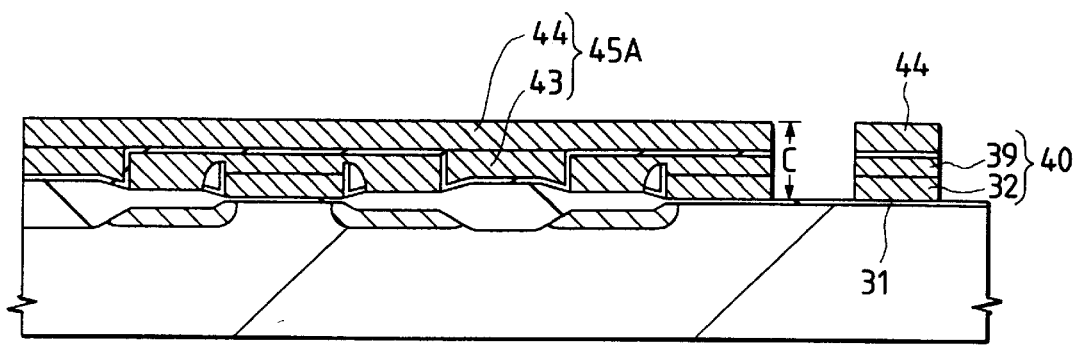
Figure 30B:
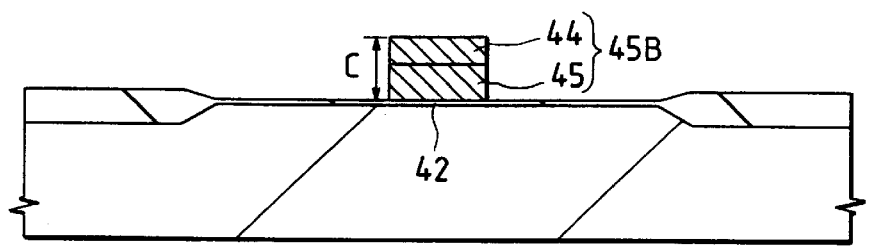

As shown in FIGS. 30(a) and 30(b), the polysilicon films 44, 43 are successively etched through a photoresist mask in a pattern as shown in FIGS. 19(a) and 19(b), thereby forming a control gate electrode 45A of the memory cell, a floating gate electrode 40 (39, 32), and a gate electrode 45B of MISFET Qn for the peripheral circuit. The gate electrode material (i.e. the polysilicon films 44, 43 and 40) is in a maximum thickness (C) above the gate oxide film 42. The etching conditions should be set while taking this thickness (C) into consideration, so that the etching off of the gate oxide film 42 or 31 can be suppressed to a minimum. The control gate 45A is formed integrally with the word line (WL). It will be noted that FIG. 19(c) is a plan view of an essential part after removal of the polysilicon film 44 by etching.

Figure 31A:
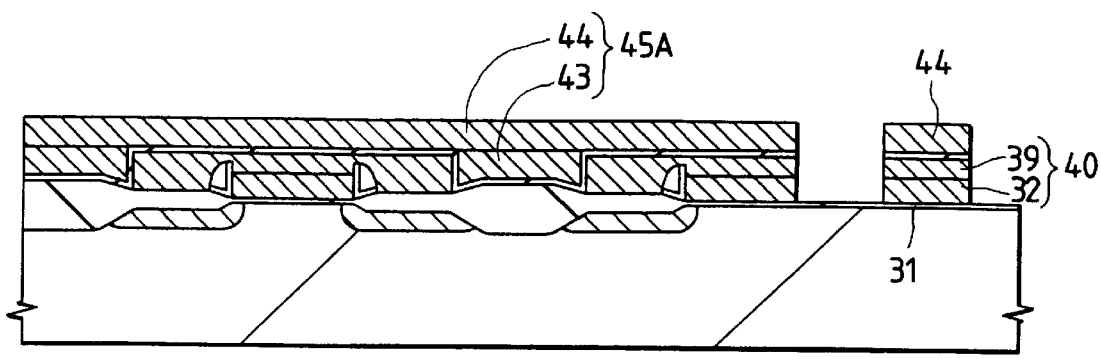
Figure 31B:
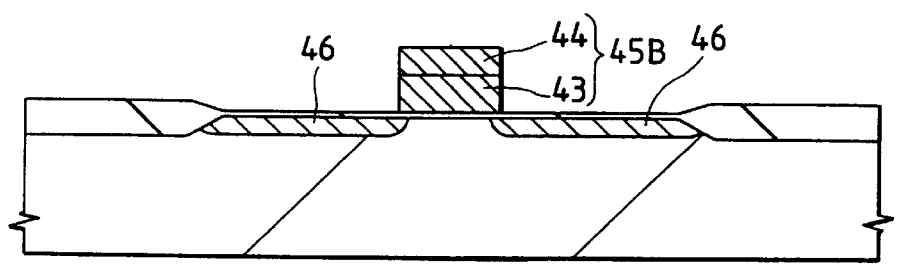

As shown in FIGS. 31(a) and 31(b), an n-type impurity (e.g. P (phosphorus)) is ion implanted into the peripheral circuit region of the semiconductor substrate 1, thereby forming n-type semiconductor regions (source, drain) 46 of MISFET Qn for the peripheral circuit. It is to be noted that information is written in MISFET's (Q) constituting memory cells by tunneling electrons via the gate insulating film 31 between the n-type semiconductive region and the floating gate electrode 40 relative to the memory cell MISFET (Q) selected by means of a buried bit line(dk) and a word line (WLn). The erasure of information can be made, for example, by tunneling of electrons via the gate insulating film between the substrate 1 and the floating gate electrode 40.

Embodiment 3

This embodiment is directed to the manufacture of a NOR flash memory wherein each memory cell is constituted of a MISFET provided with a floating gate and a control gate.

Figure 33A:
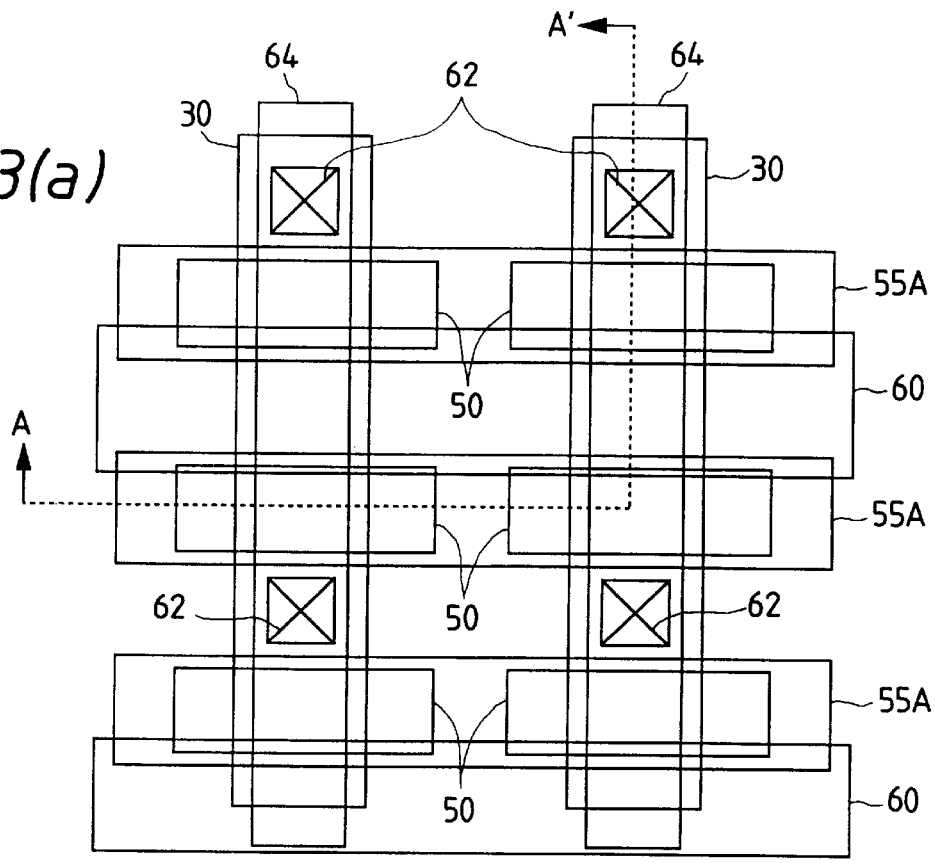
FIGS. 33(a) to 33(f) are, respectively, plan views of a NOR flash memory according to the third embodiment of the invention.
Figure 33B:
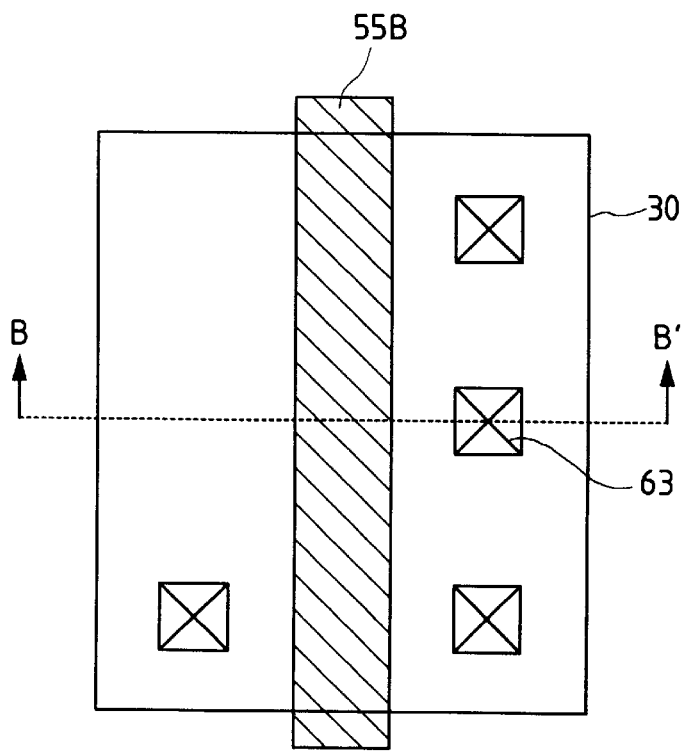

FIG. 32 is an equivalent circuit diagram of a NOR flash memory, and FIGS. 33(a), 33(c), 33(d), 33(e) and 33(f) are, respectively, a plan view of an essential part of MISFET (QM) constituting a memory cell of the NOR flash memory and FIG. 33(b) is a plan view of an n-channel MISFET Qn constituting part of a peripheral circuit of the NOR flash memory. In these figures, X-DEC indicates an X-decoder circuit, Y-DEC indicates a decoder circuit, Y-SELECT indicates a Y-select circuit and SA indicates a sense amplifier circuit. These elements used to constitute a peripheral circuit are, respectively, constituted of MISFET's Qn and Qp for the peripheral circuit.

The manufacture of the flash memory of this embodiment will be described with reference to FIGS. 33(a) to FIG. 43(b).

Figure 33C:
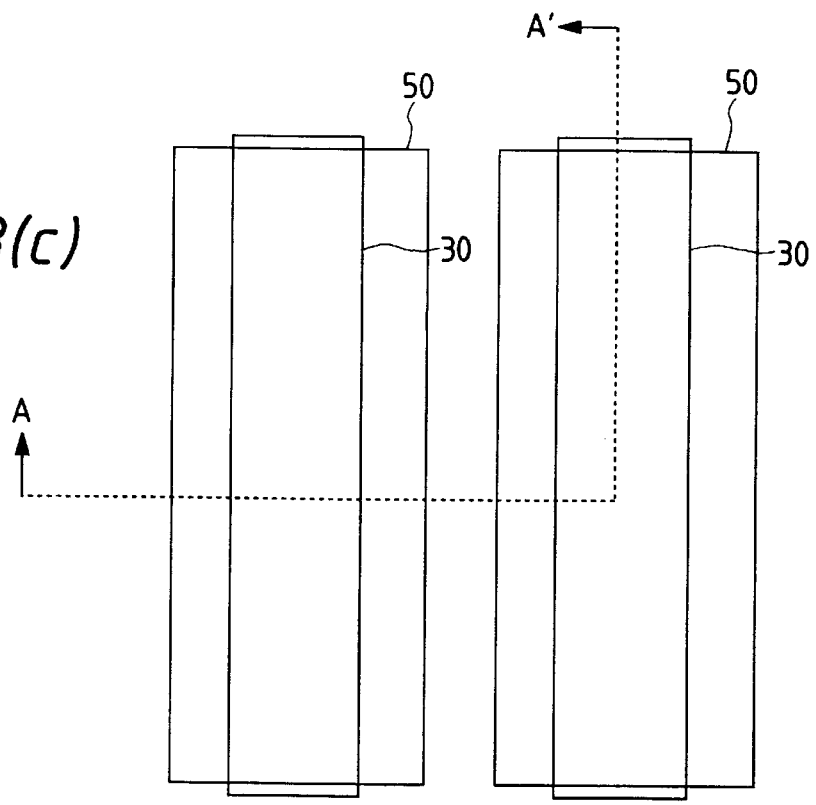
Figure 34A:
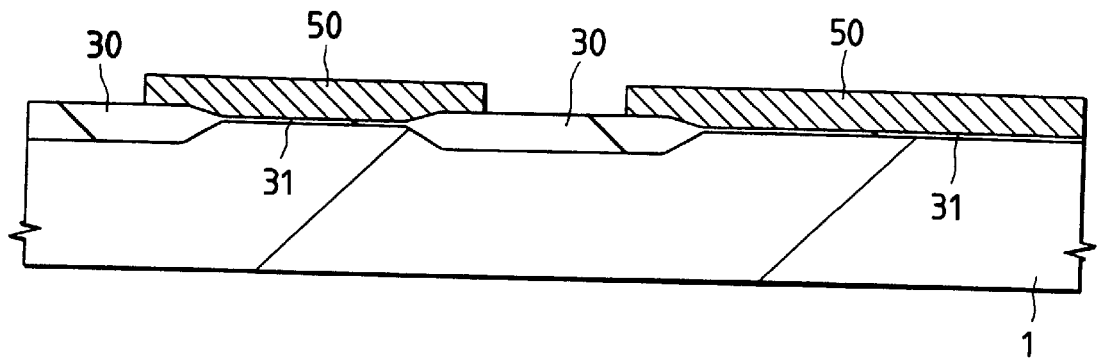
FIGS. 34(a), 34(b), 35(a), 35(b), 36-1(a), 36-1(b), 36-2(a), 36-2(b), 37(a), 37(b), 38(a), 38(b), 39(a), 39(b), FIG. 40-1(a), 40-1(b), 40-2(a), 40-2(b), 41(a), 41(b), 42(a), 42(b), 43(a) and 43(b) are, respectively, sectional views of an essential part of a semiconductor substrate illustrating steps of a method for manufacturing a NOR flash memory according to the third embodiment of the invention.
Figure 34B:
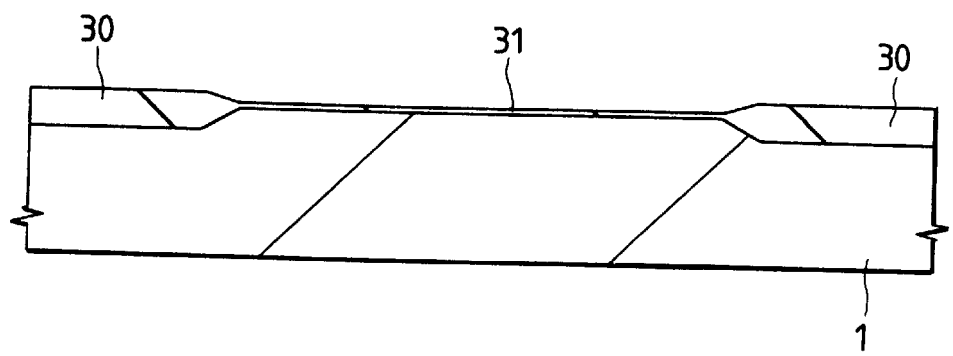

It should be noted that FIG. 34(a) is a sectional view taken along the line A—A' of FIG. 33(c) and FIG. 34(b) is a sectional view taken along the line B—B' of FIG. 33(b). This is true of the cases of FIGS. 35(a) and 35(b) to 43(a) and 43(b) except that FIGS. 36-1(a) and 36-2(a) and FIGS. 40(a) and 40(c) are, respectively, a sectional view taken along the line A—A' of FIG. 33(c) and FIGS. 36-1(b) and 36-2(b) and FIGS. 40(b) and 40(d) are, respectively, a sectional view taken along the line B—B' of FIG. 33(b).

As shown in FIGS. 34(a) and 34(b), a field oxide film 30 is formed in a device isolation region on the main surface of a semiconductor substrate 1 made of single crystal silicon, followed by forming a gate oxide film (tunnel oxide film) 31 in a device forming region. Thereafter, a polysilicon film is deposited over the semiconductor substrate 1 by a CVD method, and patterned by dry etching by use of a photoresist film mask in a manner as shown in FIG. 33(c) thereby forming a conductive pattern serving as a floating gate 50 of a memory cell.

The conductive pattern serving as the floating gate 50 may be formed on the semiconductor substrate 1 in the following manner. Initially, a first polysilicon film is deposited to a thickness larger than the difference in a step between the field oxide film 30 and the gate oxide film 31, followed by polishing of the polysilicon film by a CMP method until the field oxide film 30 is exposed on the surface thereof. Thereafter, a second polysilicon film is further deposited over the semiconductor substrate 1 to form a floating gate which is made of the two-layered polysilicon film.

Figure 35A:
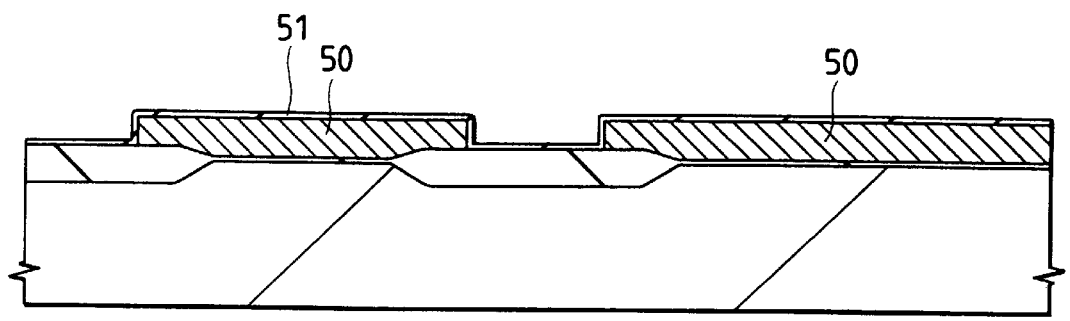
Figure 35B:
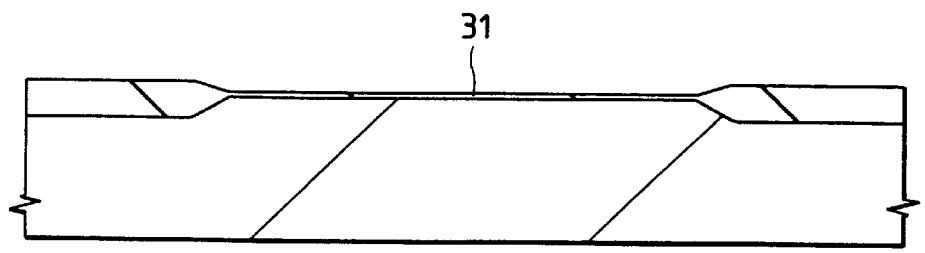

As shown in FIGS. 35(a) and 35(b), a second gate insulating film 51 of a memory cell is formed on the floating gate 50. The second gate insulating film 51 is constituted, for example, of a three-layered composite film composed of a silicon oxide film, a silicon nitride film and a silicon oxide film.

As shown in FIGS. 36-1(a), 36-1(b), 36-2(a), 36-2(b), the semiconductor substrate 1 is thermally oxidized to form a gate oxide film 42 in the peripheral circuit region, followed by deposition of a polysilicon film 52 over the entire surface of the semiconductor substrate 1. The polysilicon film 52 is so arranged as to have, in a gate electrode-forming region (i.e. a region above the gate oxide film 42) of the peripheral circuit region, a thickness (b) greater than a difference (a) in the step between the second insulating film 51 formed on the conductive pattern serving as the floating gate film 50 and the gate oxide film 31 (or the gate oxide film 42 in the peripheral circuit region). Then, as is particularly shown in FIG. 36-2(a), the polysilicon film 52 is polished on the surface thereof by a CMP method, and the surface is so flattened that the step difference and the thickness of the polysilicon film 52 in the gate electrode-forming region of the peripheral circuit-forming region, respectively, become a' (=a).

Figure 37A:
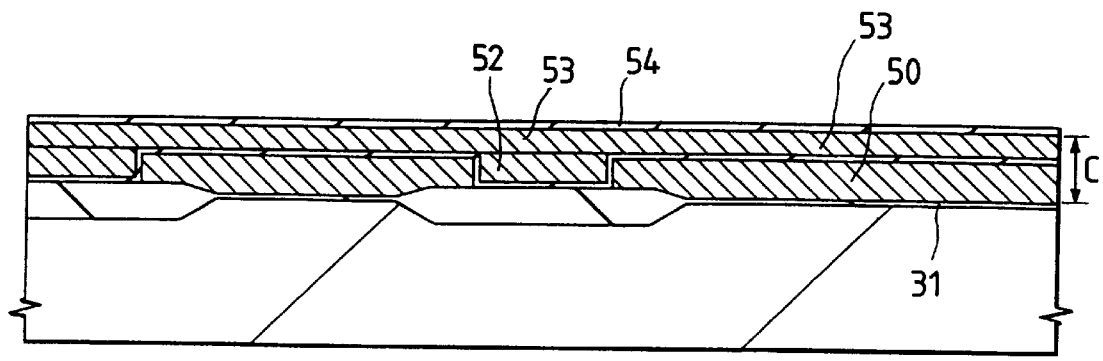
Figure 37B:
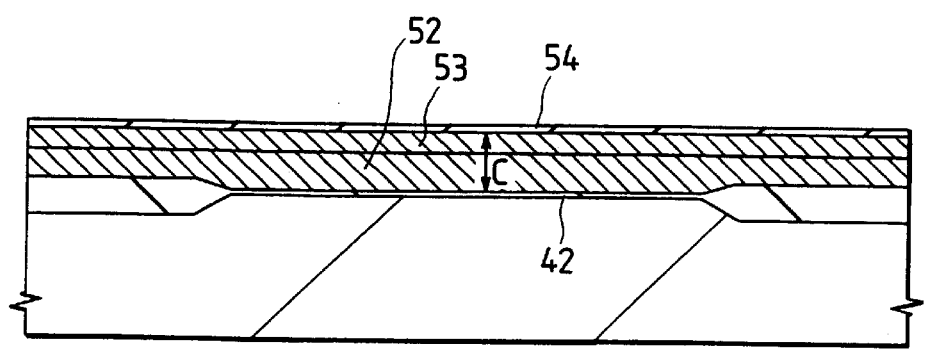

As shown in FIGS. 37(a) and 37(b), a polysilicon film 53 and a silicon oxide film 54 are successively deposited over the semiconductor substrate 1 by a CVD method. Since there is no step difference in the underlying layer of the polysilicon film 53 and the silicon oxide film 54, the surfaces of these films become flattened, under which condition the step difference between the polysilicon film 53 on the second gate insulating film 51 and the gate oxide film 31, and the total thickness of the polysilicon films 52, 53 in the gate electrode-forming region of the peripheral circuit region or on the gate oxide film 42 become C, respectively.

Figure 33D:
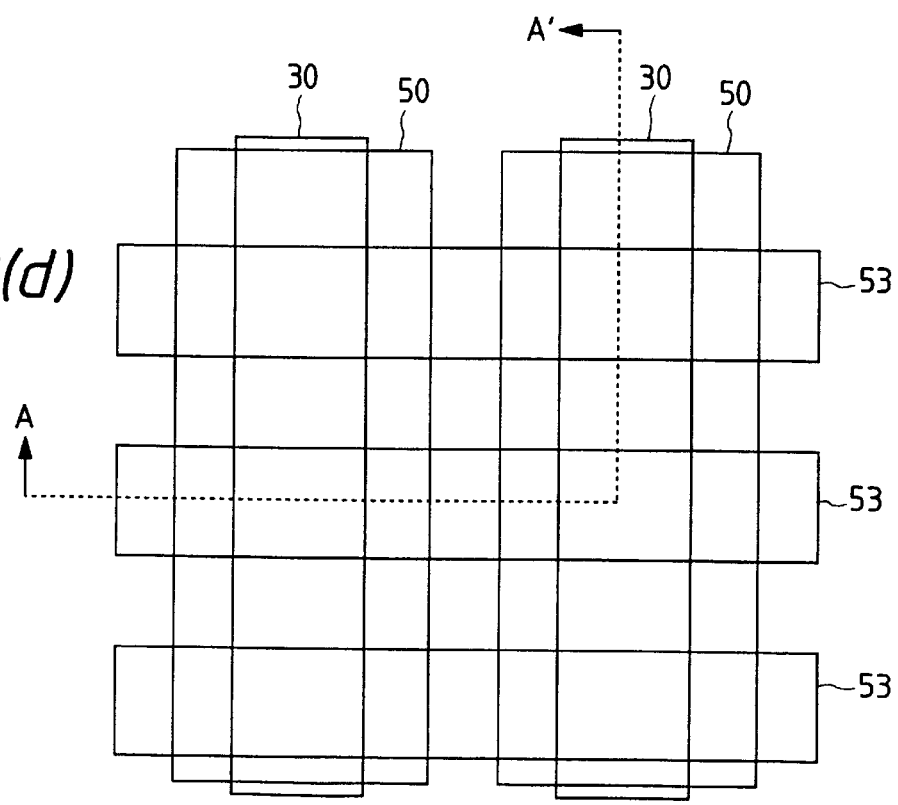
Figure 33E:
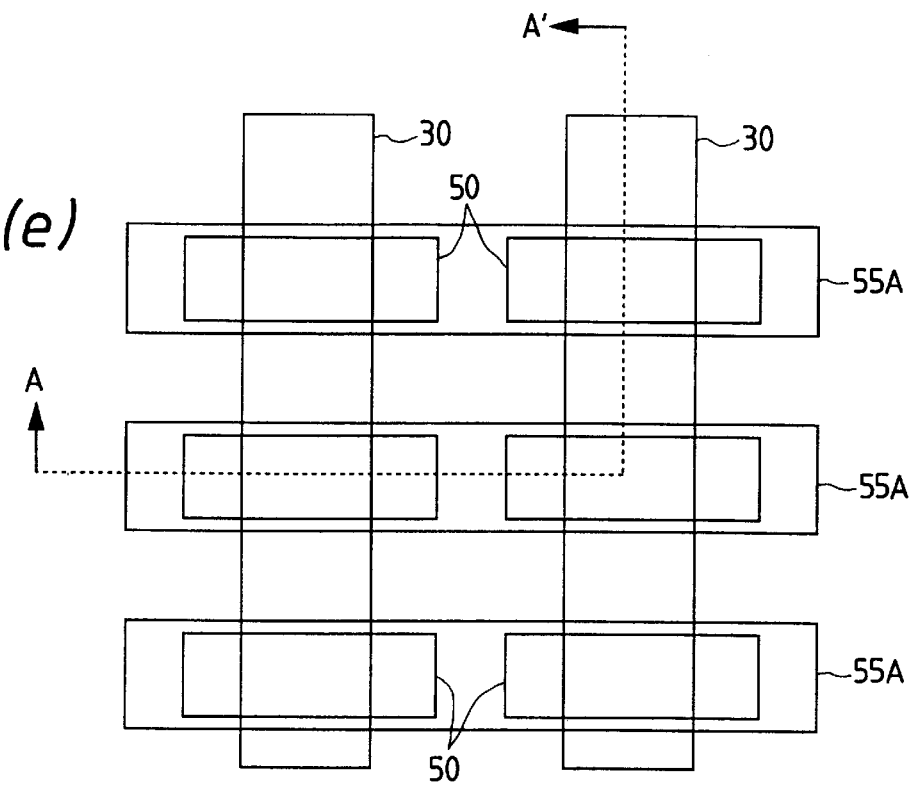
Figure 33F:
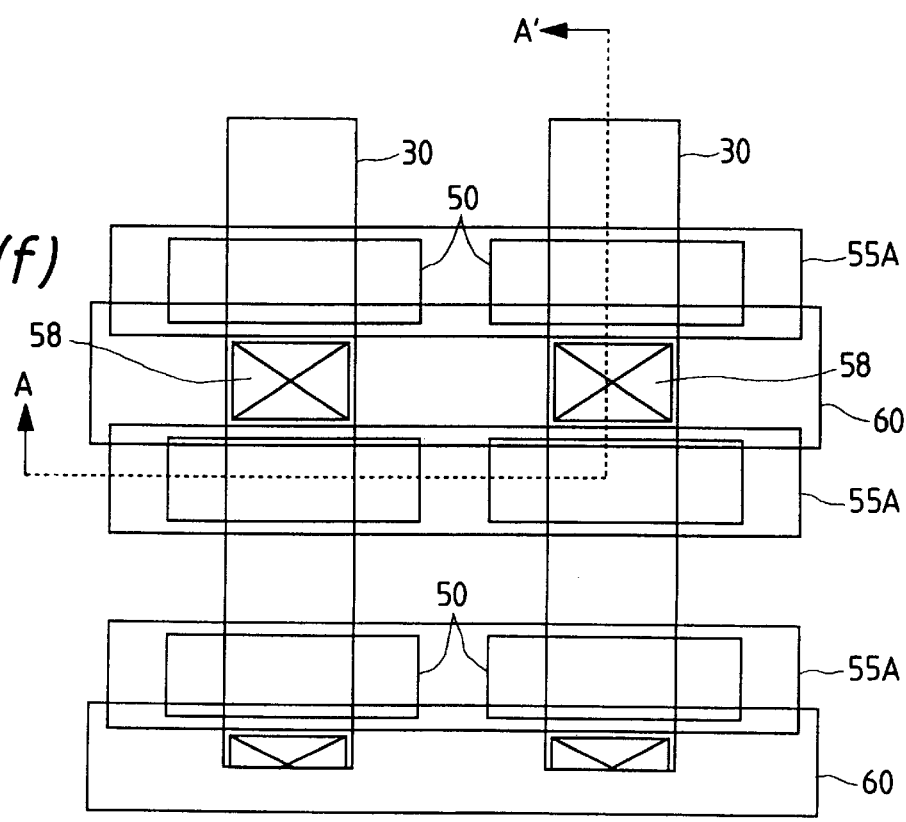

As shown in FIGS. 38(a) and 38(b), the silicon oxide film 54, the polysilicon films 53, 52, the second insulating film 51 and th floating gate 50 are successively etched in a plans pattern as shown in FIG. 33(e) by use of a photoresist mask, thereby forming a control gate 55A of the memory cell and a gate electrode 55B of MISFET of the peripheral circuit. It will be noted that FIG. 33(d) is a plan view of an essential part after removal of the polysilicon film 53 by etching. The gate electrode material to be etched in this stage has the largest thickness (C) above the gate oxide film 42. The etching conditions are so set as to coincide with this film thickness, by which the etching off of the gate oxide film can be suppressed to a minimum.

Figure 39A:
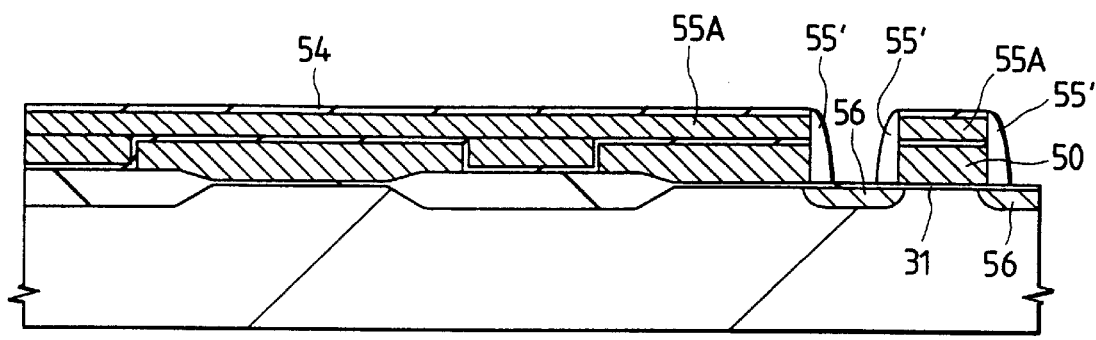
Figure 39B:
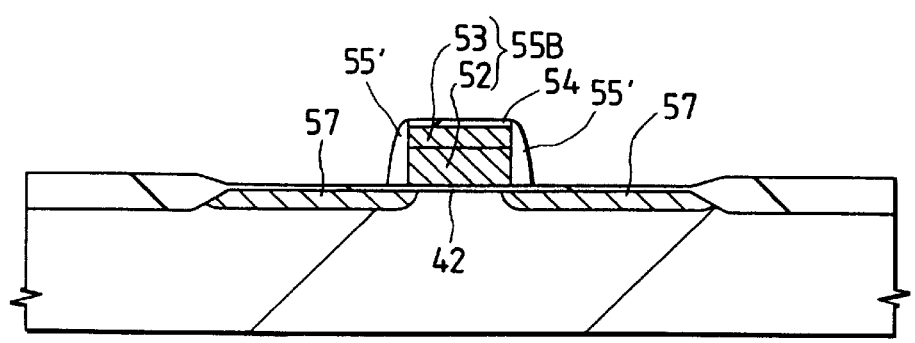

As shown in FIGS. 39(a) and 39(b), an n-type impurity (e.g. P (phosphorus)) is ion implanted into the memory cell region and the semiconductor substrate 1 of the peripheral circuit region. Thus, there are formed n-type semiconductive regions 56 (a source and a drain) of MISFET of the memory cell and n-type semiconductive regions (a source and a drain) 57 of MISFET of the peripheral circuit. Thereafter, the silicon oxide film (or the silicon nitride film) deposited on the semiconductor substrate 1 are anisotropically etched to form side wall spacers on the side walls 55' of the control gate 55A and the side walls of the gate electrode 55B.

Figures 1A, 36:
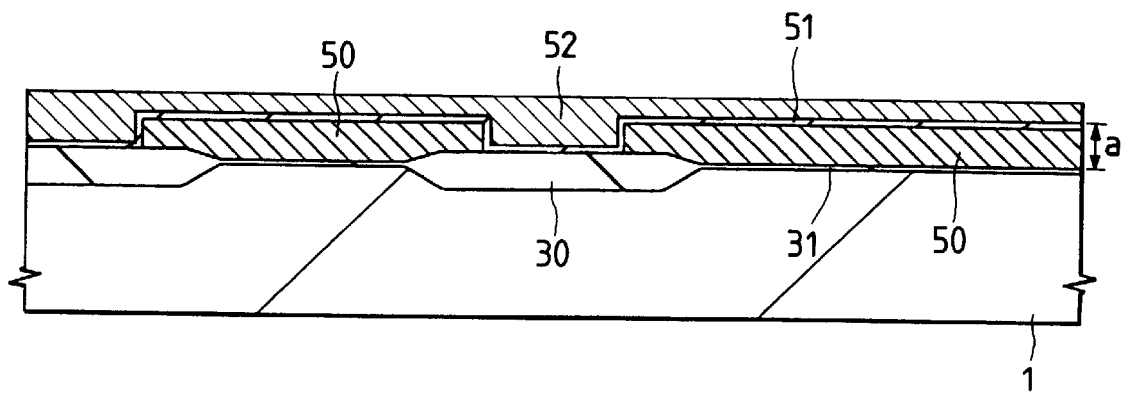
Figures 1B, 36:
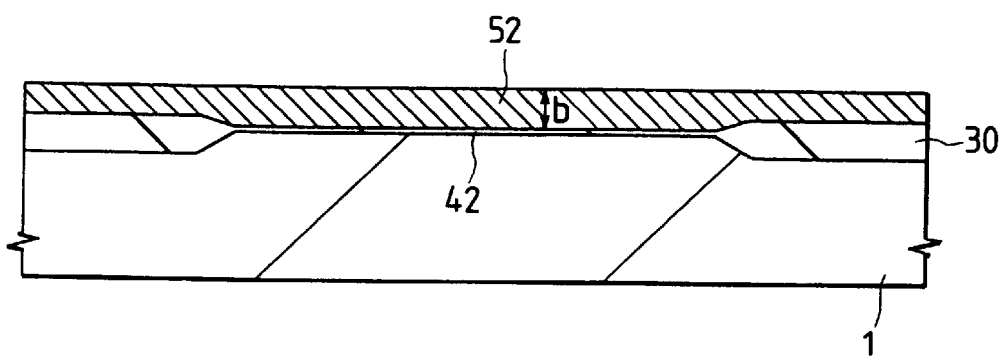
Figures 2A, 36:
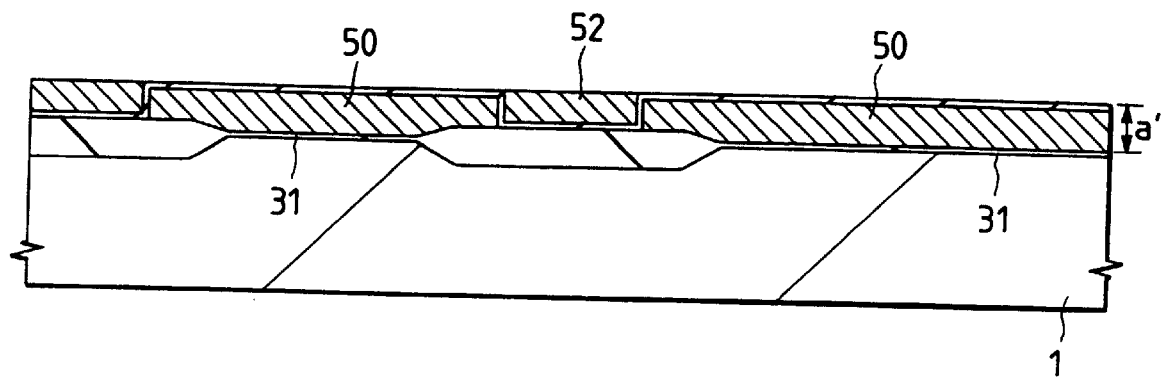
Figures 2B, 36:
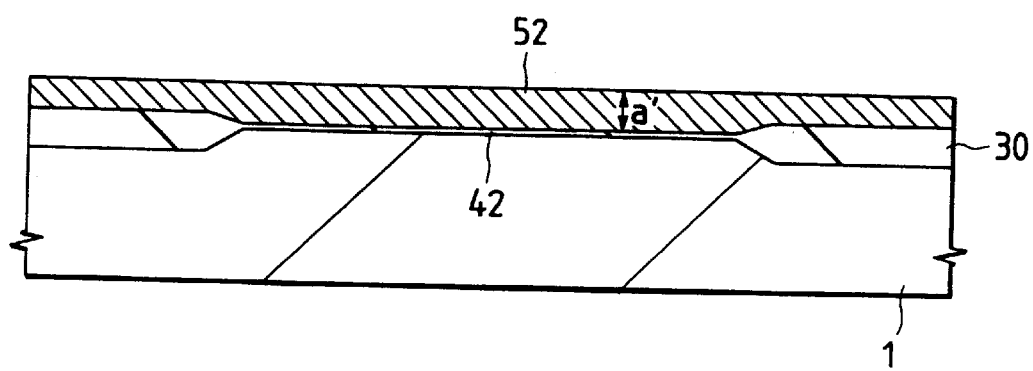
Figures 1A, 40:
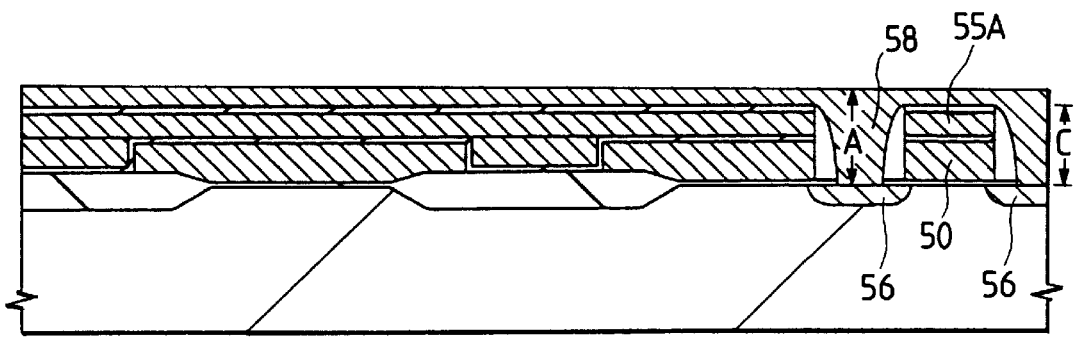
Figures 1B, 40:
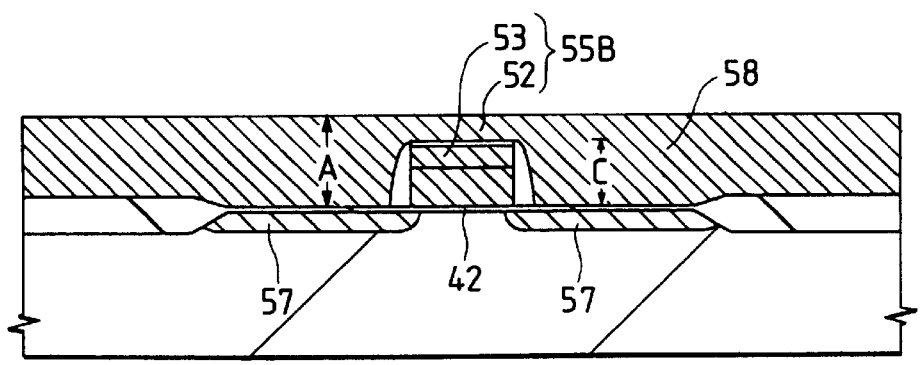
Figures 2A, 40:
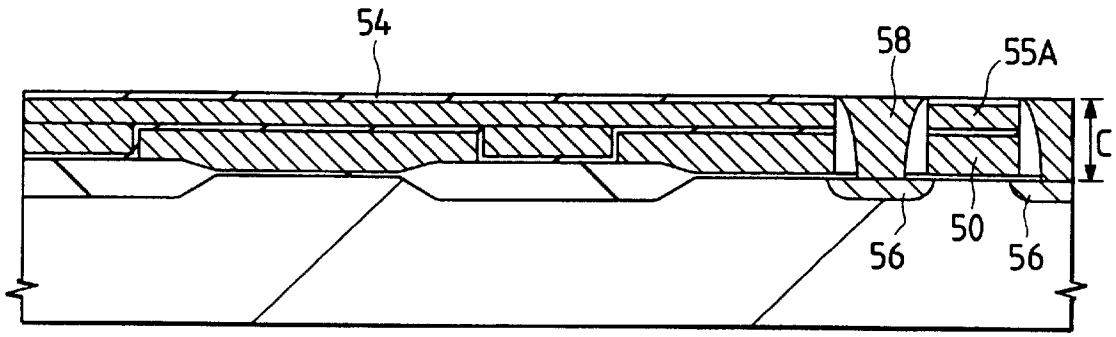
Figures 2B, 40:
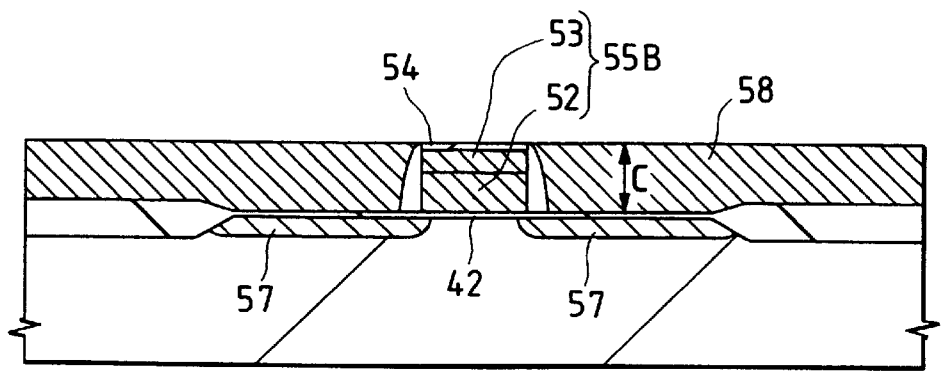

Next, the gate oxide film 31 above the n-type semiconductive region 56 of the memory cell is removed by etching. As shown in FIGS. 40-1(a), 40-1(b), a polysilicon film is deposited over the semiconductor substrate 1 to a thickness (A) larger than the difference in the step (C) between the control gate 55A and the gate electrode 55B and the gate oxide film 42. As shown in FIGS. 40-2(a), 40-2(b), the polysilicon film 58 is polished by a CMP method, thereby leaving the polysilicon film 58 with a thickness of approximately C on the n-type semiconductive region 56. At the same time, the polysilicon film 58 having a thickness of approximately C is also left on the peripheral circuit-forming region.

Figure 41A:
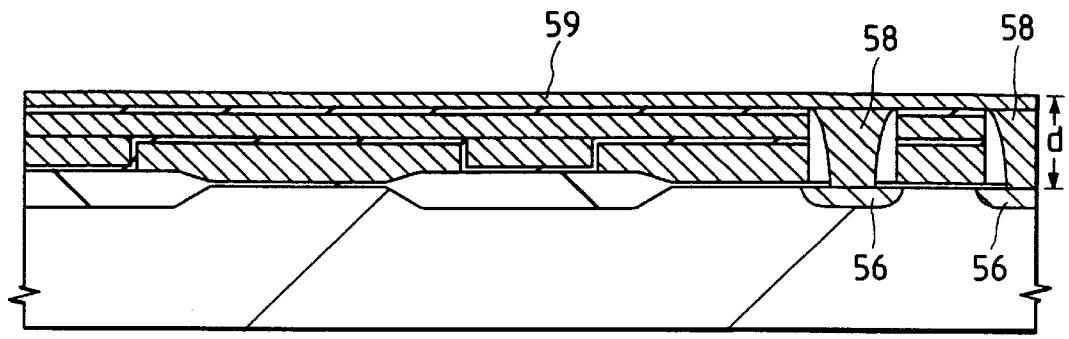
Figure 41B:
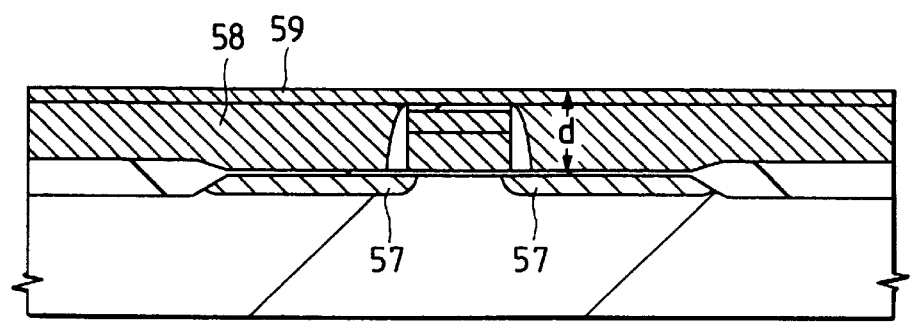
Figure 42A:
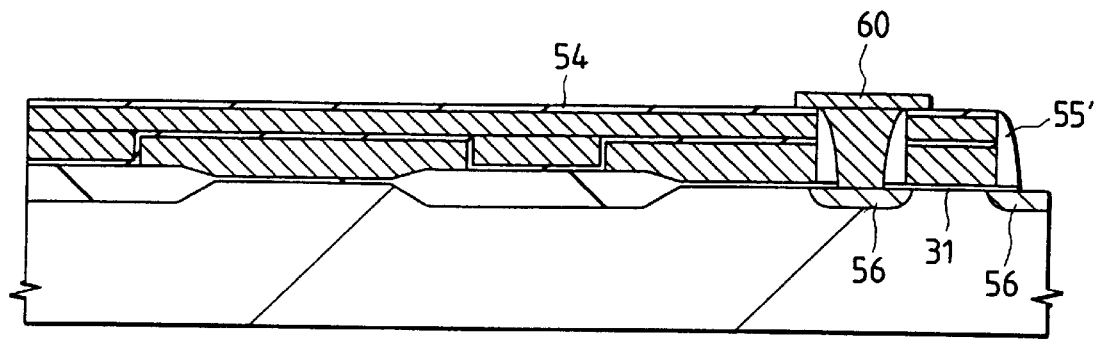
Figure 42B:
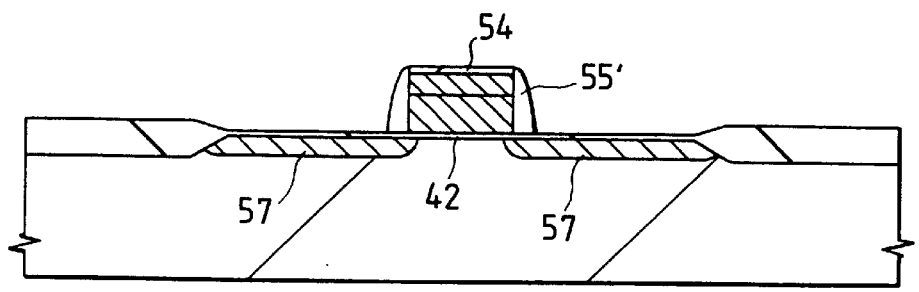

As shown in FIGS. 41(a) and 41(b), a polysilicon film 59 is deposited over the semiconductor substrate 1 by a CVD method. Since there is no step difference in the underlying layer of the polysilicon film 58 and the silicon oxide film 54, the polysilicon films 58, 59 on the n-type semiconductive regions 46, 47 become flattened so as to have a thickness of d. As shown in FIGS. 42(a) and 42(b), the polysilicon film 59 is subjected to patterning by dry etching by use of a photorasist mask in the form of a pattern shown in FIG. 33(f), thereby leaving portions above the polysilion film 58 to form a source electrode 60 made of the polysilicon films 58, 59. The gate electrode material to be etched becomes the thickest, as d, above the gate oxide film 42 (i.e. the n-type semiconductive region 57) and the n-type semiconductive region 56. The etching conditions should be set while taking this thickness into account.

Figure 43A:
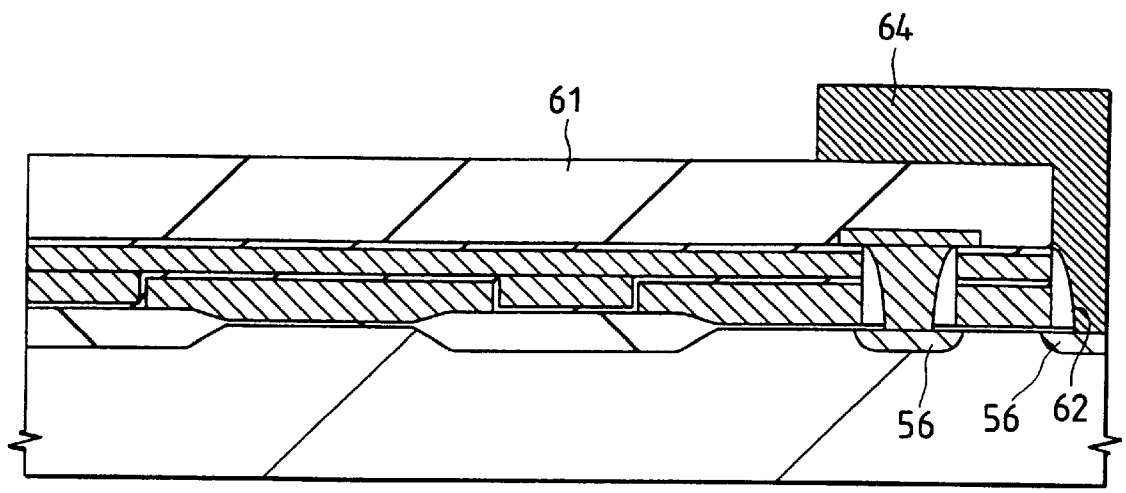
Figure 43B:
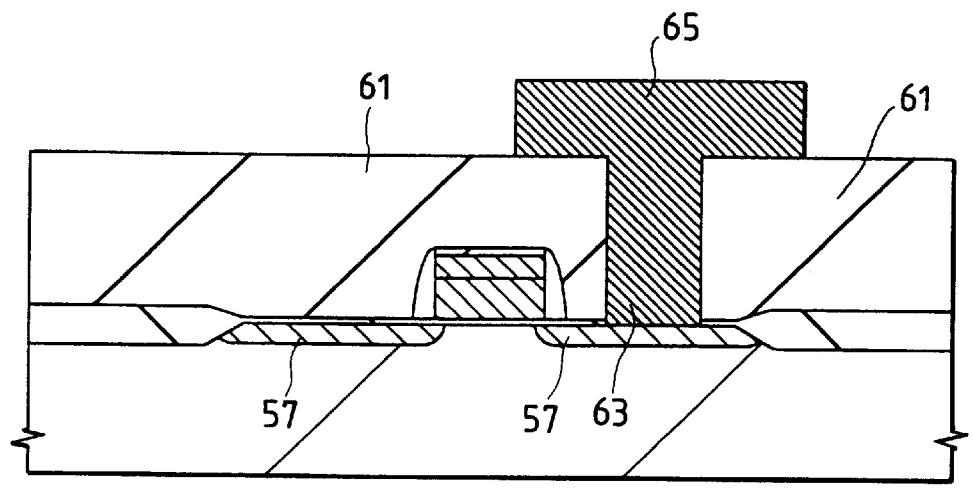

As shown in FIGS. 43(a) and 43(b), a polysilicon film 61 is deposited over the semiconductor substrate by a CVD method. The silicon oxide film 61 is removed from above the n-type semiconductive regions 56, 57 by dry etching using a photoresist mask to form contact holes 62, 63. Metal interconnections 64, 65 made, for example, of Al (aluminum) are formed over the silicon oxide film 61. The flash memory according to Embodiment 3 permits writing or erasing of information by tunneling of electrons via the gate oxide film 31 between the floating gate electrode 50 and the substrate 1 or the n-type semiconductive region 56.

The invention has been particularly described based on the embodiments described hereinabove, which should not be construed as limiting the invention thereto, since many variations or modifications may be possible without departing from the scope of the invention.

Figure 44:
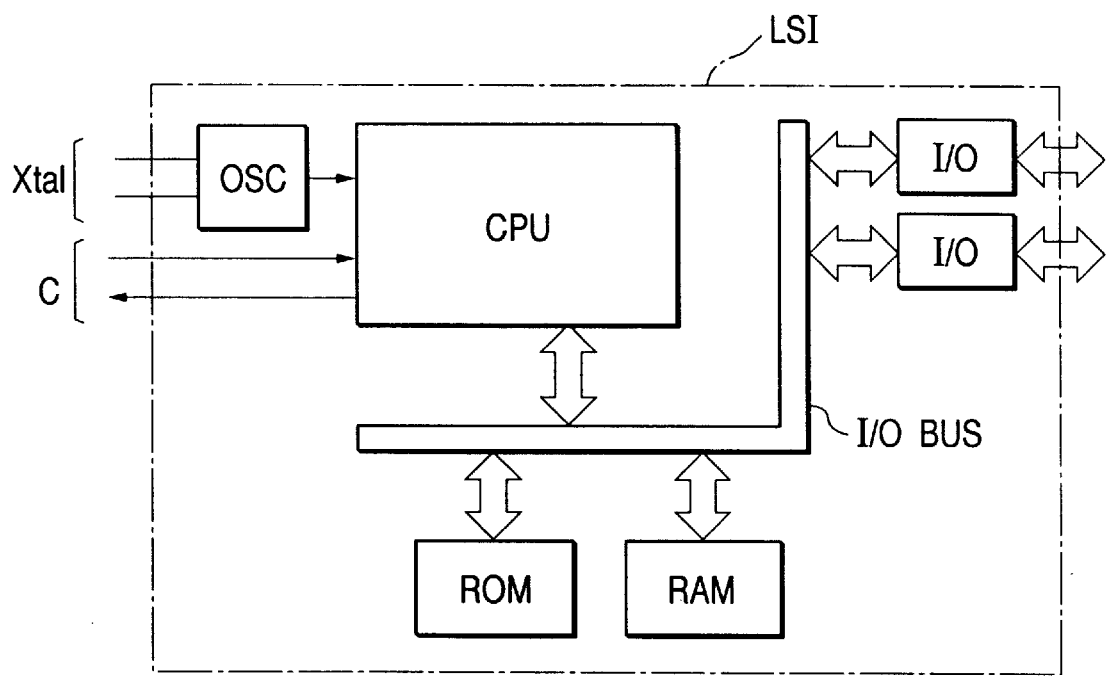
FIG. 44 is a block diagram of a hybrid semiconductor integrated circuit device according to another embodiment of the invention.

In the foregoing embodiments, the applications to a DRAM and a flash memory have been illustrated, however the method of the invention is widely applicable to processes of forming electrodes, interconnections and the like by patterning conductive materials deposited on a stepped semiconductor substrate. Moreover, the method of the invention is also applicable to the case where a polysilicon film or a tungsten silicide film is used as a conductive material or the case where an Al (aluminum) film or a high melting metal film is used. Especially, when an Al film having a high light reflectance is used, halation resulting from the reflection of exposing light can be effectively prevented. Moreover, as shown in FIG. 44, the DRAM (RAM) or the flash memory (ROM) illustrated in the embodiments of the invention can be applied to hybrid semiconductor integrated circuit devices LSI wherein a logic circuit (CPU) is hybridized. The logic circuit (CPU) is arranged to have a structure similar to MISFET Qn or Qp for the peripheral circuit described in the embodiments. In the figure, I/O indicates an input-output circuit, and I/O Bus indicates a bus wiring. RAM is, for example, a DRAM illustrated in Embodiment 1 of the invention, and ROM is, for example, a flash memory as illustrated in Embodiments 2, 3 of the invention.

As will be apparent from the foregoing, according to the invention, when a conductive film deposited on a gate electrode of a MISFET is subjected to patterning, etching off of a gate oxide film as will be caused by over-etching can be fully prevented. Moreover, a conductive film pattern at end portions of the gate electrode caused by halation can be formed without involving any lowering of the dimensional accuracy thereof.

What is claimed is:

1. A method of manufacturing a semiconductor integrated circuit device which comprises the steps of: forming a first MISFET on a first region of a main surface of a semiconductor substrate and also a second MISFET on a second region of the main surface; forming a connection hole above one of a source and a drain of the first MISFET; forming, over the connection hole of said first region and also on a drain and source region of said second MISFET, a first conductive film which has a thickness larger than the difference in a step formed between the upper portion of a gate electrode of said first MISFET and a gate oxide film of said first MISFET and which has a thickness larger than the difference in a step formed between the upper portion of a gate electrode of said second MISFET and a gate oxide film of said second MISFET; processing the first conductive film so that the difference in the step in said first region and the difference in the step in said second region are substantially equal to each other; forming a second conductive film on said first conductive film; and subjecting said second conductive film to patterning in a desired shape in said first region through a photoresist mask formed on said second conductive film and simultaneously removing said second conductive film from said second region.

2. A method according to claim 1, wherein said first MISFET consists of a memory cell selection MISFET constituting a memory cell of a DRAM, said first and second conductive films constitute a lower electrode of an information storage capacitor element disposed on said memory cell selection MISFET, and said second MISFET is for a peripheral circuit.

3. A method according to claim 1 or 2, wherein said first conductive film is processed by chemical mechanical polishing (CMP).

4. A method according to claim 3, wherein the first and second conductive films are each made of polysilicon.

5. A method of manufacturing a semiconductor integrated circuit device which comprises the steps of: forming a gate oxide film on a first region and a second region of a main surface of a semiconductor substrate; forming a first conductive film on the first region of the main surface of said semiconductor substrate; forming, on the second region of the main surface of said semiconductor substrate and also on the first conductive film in the first region, a second conductive film to a thickness which is larger than the difference in a step formed between the first conductive film and the gate oxide film; processing the second conductive film so that the difference in a step formed between the second conductive film formed on the first conductive film in the first region and the gate oxide film and also the difference in a step formed between the second conductive film and the gate oxide film in the second region are made substantially equal to each other; forming a third conductive film on the first conductive film at the first region and on the second conductive film at the second region; and patterning the second conductive film and the first conductive film at the first region and simultaneously patterning the second conductive film at the second region.

6. A method according to claim 5, wherein the first conductive film at the first region acts as a floating gate electrode, wherein the second conductive film at the first region serves as a control gate electrode, and wherein the second and the third conductive films at the second region serve as a gate electrode of a MISFET in the second region.

7. A method according to claim 5 or 6, wherein the differences in the steps are made equal to each other by CMP.

8. A method according to claim 7, wherein the first and second conductive films are each made of a polysilicon film.

* * * * *